(12) United States Patent  
Lim

(10) Patent No.: US 11,233,004 B2  
(45) Date of Patent: Jan. 25, 2022

(54) SEMICONDUCTOR DEVICE HAVING A STACKED STRUCTURE

(71) Applicant: SAMSUNG ELECTRONICS CO., LTD., Suwon-si (KR)

(72) Inventor: Geunwon Lim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 60 days.

(21) Appl. No.: 16/732,772

(22) Filed: Jan. 2, 2020

(65) Prior Publication Data

US 2020/0402906 A1 Dec. 24, 2020

(30) Foreign Application Priority Data

Jun. 20, 2019 (KR) .................. 10-2019-0073505

(51) Int. Cl.

| | |
|---|---|
| *H01L 27/11578* | (2017.01) |
| *H01L 23/522* | (2006.01) |
| *H01L 27/11519* | (2017.01) |
| *H01L 27/11548* | (2017.01) |
| *H01L 27/11582* | (2017.01) |
| *H01L 27/11565* | (2017.01) |
| *H01L 27/11575* | (2017.01) |
| *H01L 27/11556* | (2017.01) |

(52) U.S. Cl.
CPC .... *H01L 23/5226* (2013.01); *H01L 27/11519* (2013.01); *H01L 27/11548* (2013.01); *H01L 27/11556* (2013.01); *H01L 27/11565* (2013.01); *H01L 27/11575* (2013.01); *H01L 27/11582* (2013.01)

(58) Field of Classification Search
CPC .............................................. H01L 27/11578
See application file for complete search history.

(56) References Cited

U.S. PATENT DOCUMENTS

| 9,087,861 B2 | 7/2015 | Hwang et al. |
| 9,620,522 B1 | 4/2017 | Lee |
| 9,634,016 B2 | 4/2017 | Kim et al. |
| (Continued) | | |

FOREIGN PATENT DOCUMENTS

KR   10-2019-0123170   10/2019

*Primary Examiner* — Christopher A Johnson  
(74) *Attorney, Agent, or Firm* — F. Chau & Associates, LLC

(57) ABSTRACT

A semiconductor device includes a substrate having a cell array region and a pad region, a stack structure including gate electrodes and mold insulating layers alternately stacked on the substrate and having a staircase shape in the pad region, first separation regions penetrating the stack structure in the pad region, extending in a first direction, and including first and second dummy insulating layers, the first dummy insulating layers covering side walls of the first separation regions and including horizontal portions covering portions of the gate electrodes, and the second dummy insulating layers disposed between the first dummy insulating layers, extending portions extending towards the mold insulating layers from the first dummy insulating layers in a second direction perpendicular to the first direction, second separation regions dividing the stack structure and extending in the first direction, and cell contact plugs penetrating the horizontal portions and connected to the gate electrodes.

20 Claims, 29 Drawing Sheets

(56) References Cited

U.S. PATENT DOCUMENTS

| | | |
|---|---|---|
| 9,780,104 B2 | 10/2017 | Nomachi et al. |
| 9,991,271 B2 | 6/2018 | Kang et al. |
| 2013/0252391 A1 | 9/2013 | Lee et al. |
| 2017/0294388 A1 | 10/2017 | Yoon et al. |
| 2017/0358590 A1* | 12/2017 | Kang ................ H01L 27/11556 |
| 2018/0294273 A1 | 10/2018 | Liao et al. |
| 2019/0252403 A1* | 8/2019 | Kaminaga ......... H01L 27/11573 |
| 2019/0326169 A1 | 10/2019 | Lim et al. |

* cited by examiner

SEMICONDUCTOR DEVICE HAVING A STACKED STRUCTURE

CROSS-REFERENCE TO RELATED APPLICATION

This application claims priority under 35 U.S.C. § 119 to Korean Patent Application No. 10-2019-0073505, filed on Jun. 20, 2019 in the Korean Intellectual Property Office, the disclosure of which is incorporated by reference herein in its entirety.

TECHNICAL FIELD

Exemplary embodiments of the present inventive concept relate to a semiconductor device having a stacked structure.

DISCUSSION OF RELATED ART

There has been an increasing demand for semiconductor devices with reduced volume capable of processing high capacity data. Accordingly, integration density of semiconductor elements included in semiconductor devices needs to be increased. To improve integration density of a semiconductor device, a vertical transistor structure may be used instead of a planar transistor structure.

SUMMARY

According to an exemplary embodiment of the present inventive concept, a semiconductor device includes a substrate having a cell array region and a pad region, a stack structure including gate electrodes and mold insulating layers alternately stacked on the substrate and having a staircase shape in the pad region, a plurality of first separation regions penetrating the stack structure vertically in the pad region, extending in a first direction, and including first dummy insulating layers and second dummy insulating layers, where the first dummy insulating layers cover internal side walls of the plurality of first separation regions and include horizontal portions covering portions of upper surfaces of upper gate electrodes of the gate electrodes, and the second dummy insulating layers are disposed between the first dummy insulating layers, extending portions extending towards the mold insulating layers from the first dummy insulating layers in a second direction perpendicular to the first direction, a plurality of second separation regions dividing the stack structure into a plurality of regions and extending in the first direction, and cell contact plugs penetrating the horizontal portions in the second dummy insulating layers and connected to the gate electrodes.

According to an exemplary embodiment of the present inventive concept, a semiconductor device includes a substrate having a cell array region and a pad region, a stack structure including gate electrodes and mold insulating layers having a staircase shape in the pad region, an interlayer insulating layer covering the stack structure in the pad region, a plurality of first separation regions penetrating the stack structure and the interlayer insulating layer in the pad region, where the plurality of first separation regions include first insulating layers covering one end of the gate electrodes and extending in a direction substantially perpendicular to an upper surface of the substrate, and second insulating layers disposed between the first insulating layers, a plurality of second separation regions dividing the stack structure into a plurality of regions on the substrate and extending in a first direction, at least one dummy channel disposed between the plurality of first separation regions and the plurality of second separation regions, and cell contact plugs penetrating the first insulating layers and connected to the gate electrodes in the plurality of first separation regions.

According to an exemplary embodiment of the present inventive concept, a semiconductor device includes a substrate having a cell array region and a pad region, a stack structure including gate electrodes and mold insulating layers alternately stacked on the substrate and having a staircase shape in the pad region, an interlayer insulating layer covering the stack structure in the pad region, dummy insulating layers dividing the stack structure and the interlayer insulating layer into a plurality of regions and including a material different from a material of the interlayer insulating layer, extending portions in contact with the dummy insulating layers in the stack structure, and spaced apart from one another in a direction substantially perpendicular to an upper surface of the substrate between the gate electrodes, and cell contact plugs disposed in the dummy insulating layers and connected to the gate electrodes.

BRIEF DESCRIPTION OF DRAWINGS

The above and other aspects and features of the present inventive concept will be more clearly understood by describing in detail exemplary embodiments thereof with reference to the accompanying drawings.

DETAILED DESCRIPTION OF THE EMBODIMENTS

Figure 1:
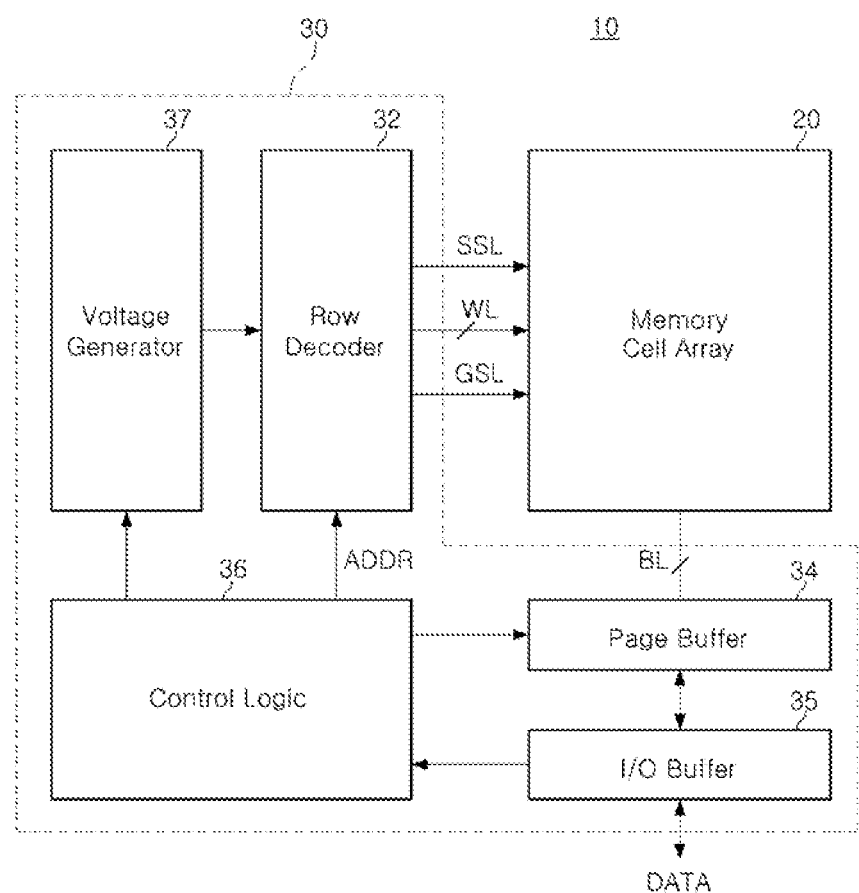
FIG. 1 is a block diagram illustrating a semiconductor device according to an exemplary embodiment of the present inventive concept.

Exemplary embodiments of the present inventive concept provide a semiconductor device having improved reliability.

Hereinafter, exemplary embodiments of the present inventive concept will be described with reference to the accompanying drawings Like reference numerals may refer to like elements throughout this application.

FIG. 1 is a block diagram illustrating a semiconductor device according to an exemplary embodiment of the present inventive concept.

Referring to FIG. 1, a semiconductor device 10 may include a memory cell array 20 and a peripheral circuit 30. The peripheral circuit 30 may include a row decoder 32, a page buffer 34, an input and output buffer 35, a control logic 36, and a voltage generator 37.

The memory cell array 20 may include a plurality of memory blocks, and each of the memory blocks may include a plurality of memory cells. The plurality of memory cells may be connected to the row decoder 32 through a string selection line SSL, word lines WL, and a ground selection line GSL, and may be connected to the page buffer 34 through bit lines BL. In exemplary embodiments of the present inventive concept, a plurality of memory cells arranged in the same row may be connected to the same word line WL, and a plurality of memory cells arranged in the same column may be connected to the same bit line BL.

The row decoder 32 may decode an input address ADDR from the control logic 36, and may generate and transfer driving signals of a word line WL. The row decoder 32 may provide a word line voltage generated by the voltage generator 37 to each of a selected word line WL and non-selected word lines WL in response to control of the control logic 36.

The page buffer 34 may be connected to the memory cell array 20 through the bit lines BL and may read out information stored in the memory cells. The page buffer 34 may temporarily store data to be stored in the memory cells or may sense data stored in the memory cells. The page buffer 34 may include a column decoder and a sense amplifier. The column decoder may selectively activate the bit lines BL of the memory cell array 20, and the sense amplifier may sense a voltage of a bit line BL selected by the column decoder in a readout operation and may read out data stored in a selected memory cell.

The input and output buffer 35 may receive data DATA and may transfer the data DATA to the page buffer 34 during a program operation, and may output the data DATA received from the page buffer 34 to an external entity during a readout operation. The input and output buffer 35 may transfer an input address or an input command to the control logic 36.

The control logic 36 may control operations of the row decoder 32 and the page buffer 34. The control logic 36 may receive a control signal and an external voltage transferred from an external entity, and may operate in response to the received control signal. The control logic 36 may control a readout operation, a writing operation, and/or an erasing operation in response to the control signal.

The voltage generator 37 may generate a program voltage, a readout voltage, an erasing voltage, or the like, for example, required for an internal operation using an external voltage. The voltage generated by the voltage generator 37 may be transferred to the memory cell array 20 through the row decoder 32.

Figure 2:
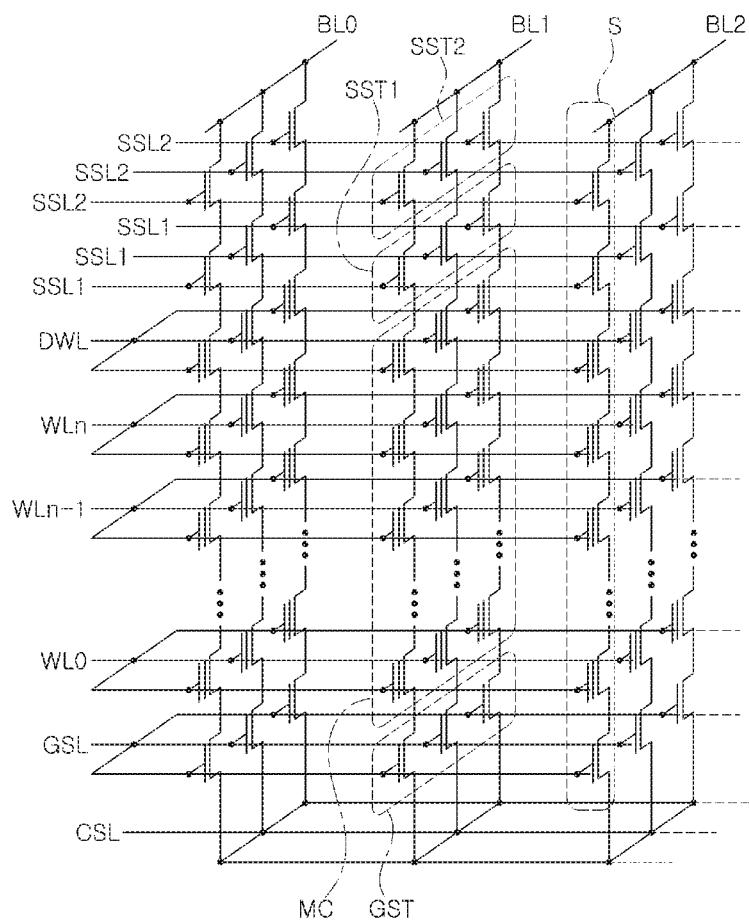
FIG. 2 is an equivalent circuit diagram illustrating a cell array of the semiconductor device of FIG. 1 according to an exemplary embodiment of the present inventive concept.

FIG. 2 is an equivalent circuit diagram illustrating a cell array of the semiconductor device of FIG. 1 according to an exemplary embodiment of the present inventive concept.

Referring to FIG. 2, the memory cell array 20 may include a plurality of memory cell strings S including memory cells MC connected to one another in series, and a ground selection transistor GST and string selection transistors SST1 and SST2 connected to both ends of the memory cells MC in series. The plurality of memory cell strings S may be connected to bit lines BL0 to BL2 in parallel. The plurality of memory cell strings S may be connected to a common source line CSL in common. Accordingly, the plurality of memory cell strings S may be disposed between the plurality of bit lines BL0 to BL2 and a single common source line CSL. In an exemplary embodiment of the present inventive concept, a plurality of common source lines may be arranged two-dimensionally.

The memory cells MC, connected to one another in series, may be controlled by word lines WL0 to WLn for selecting the memory cells MC. Each of the memory cells MC may include a data storage element. Gate electrodes of the memory cells MC disposed at substantially the same distance from the common source line CSL may be connected to one of the word lines WL0 to WLn and may be in an equipotential state. Alternatively, even when the gate electrodes of the memory cells MC are disposed at substantially the same distance from the common source line CSL, gate electrodes disposed in different rows or different columns may be independently controlled.

The ground selection transistor GST may be controlled by the ground selection line GSL, and may be connected to the common source line CSL. The string selection transistors SST1 and SST2 may be controlled by string selection lines SSL1 and SSL2, and may be connected to the bit lines BL0 to BL2. FIG. 2 illustrates an example in which a single ground selection transistor GST and two string selection transistors SST1 and SST2 are connected to each of the plurality of memory cells MC connected to one another in series, but the inventive concept is not limited thereto. A single string selection transistor may be connected to each of the memory cells MC, or a plurality of ground selection transistors may be connected to each of the memory cells MC. One or more dummy lines DWL or buffer lines may further be disposed between an uppermost word line WLn of the word lines WL0 to WLn and the string selection lines SSL1 and SSL2. In an exemplary embodiment of the present inventive concept, one or more dummy lines DWL may also be disposed between a lowermost word line WL0 and the ground selection line GSL.

When a signal is applied to the string selection transistors SST1 and SST2 through the string selection lines SSL1 and SSL2, a signal applied through the bit lines BL0 to BL2 may be transferred to the memory cells MC connected to one another in series, and accordingly, a data readout operation and a data writing operation may be performed. Additionally, by applying a certain level of erasing voltage through a substrate, an erasing operation for erasing data written in the memory cells MC may be performed. In an exemplary embodiment of the present inventive concept, the memory cell array 20 may further include at least one dummy memory cell string electrically separated from the bit lines BL0 to BL2.

Figure 3:
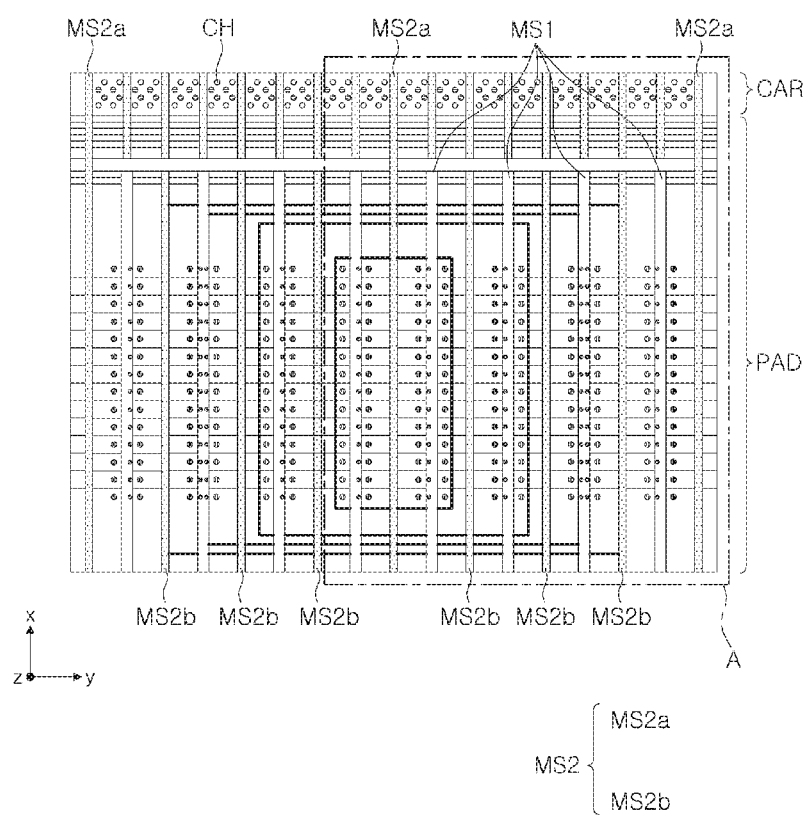
FIG. 3 is a plan diagram illustrating a semiconductor device according to an exemplary embodiment of the present inventive concept.
Figure 4:
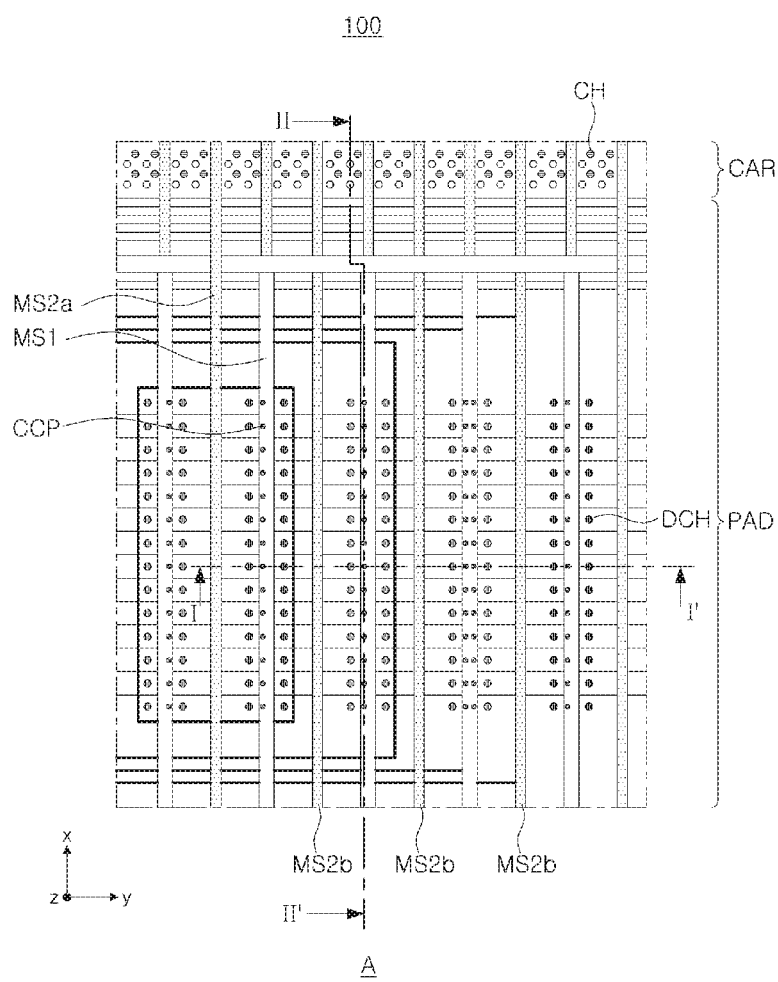
FIG. 4 is an enlarged diagram illustrating a region A of FIG. 3 according to an exemplary embodiment of the present inventive concept.
Figure 5A:
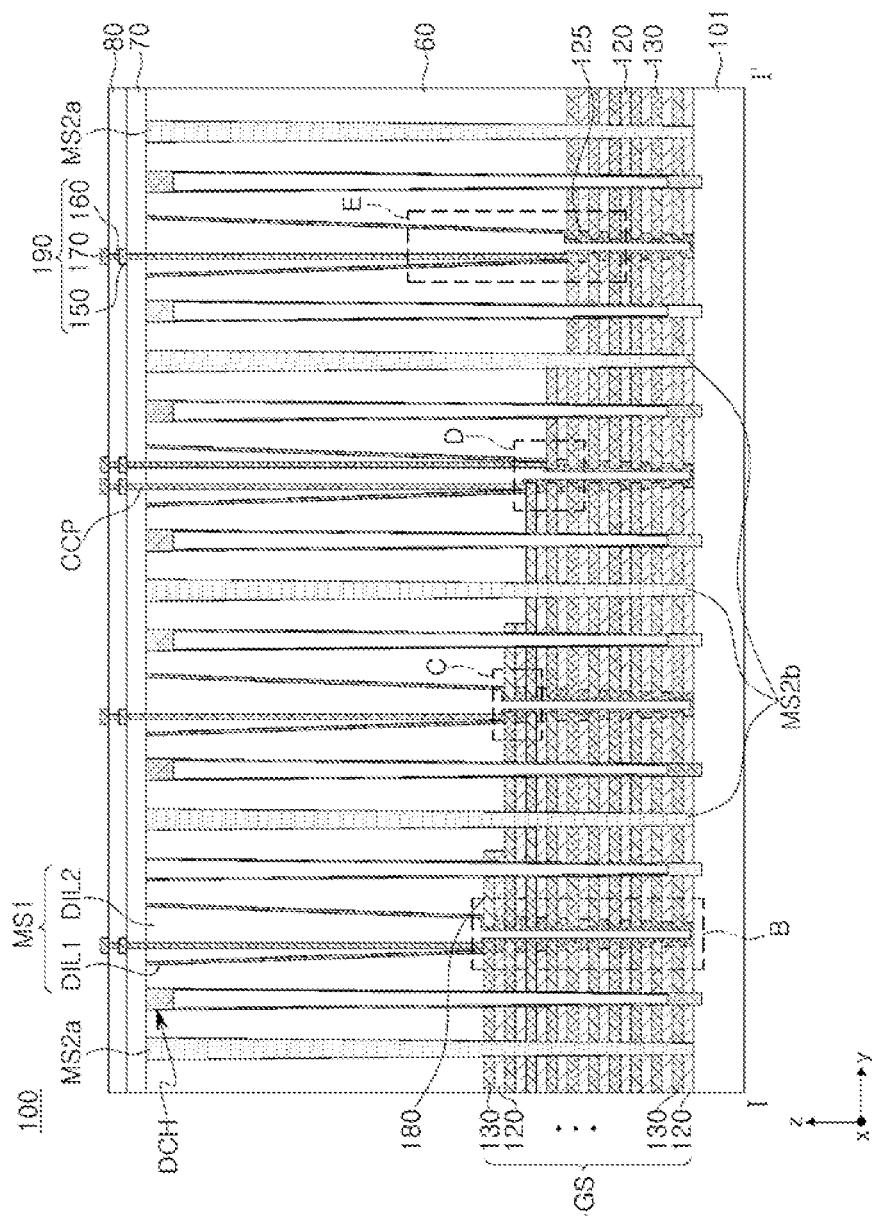
FIG. 5A is a cross-sectional diagram illustrating a cross-sectional surface of the semiconductor device of FIG. 4 taken along line I-I', according to an exemplary embodiment of the present inventive concept.
Figure 5B:
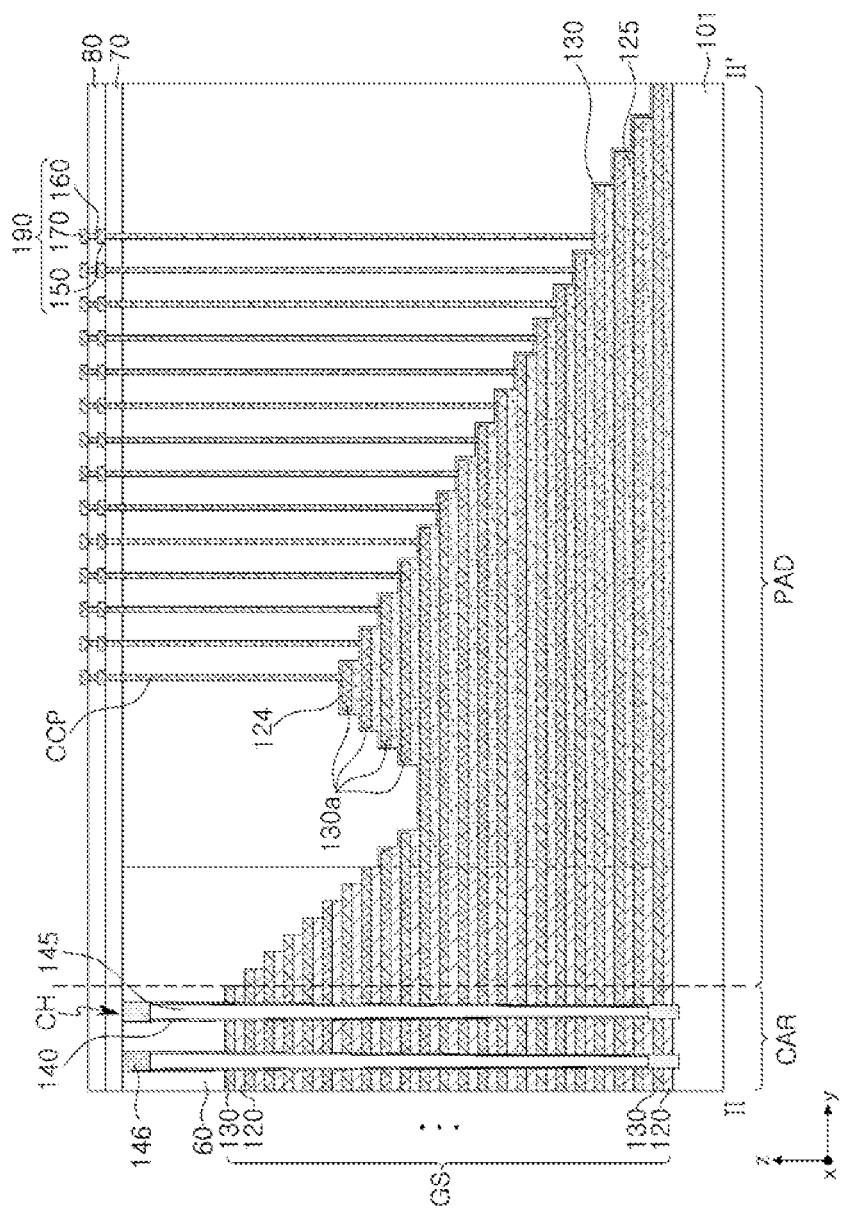
FIG. 5B is a cross-sectional diagram illustrating a cross-sectional surface of the semiconductor device of FIG. 4 taken along line II-II', according to an exemplary embodiment of the present inventive concept.
Figure 5C:
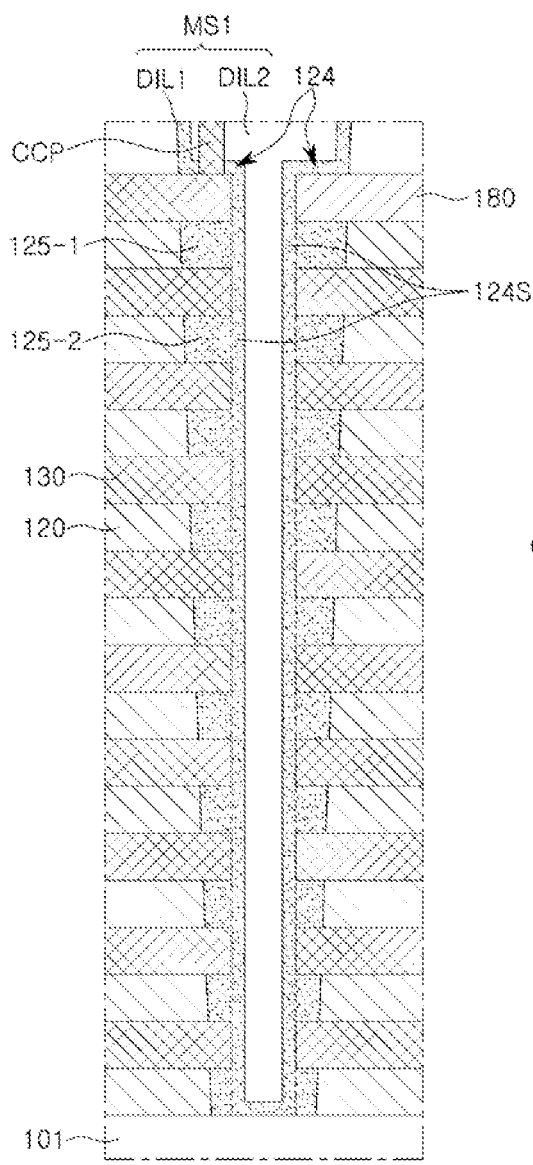
FIG. 5C is an enlarged cross-sectional diagram illustrating a region B of FIG. 5A according to an exemplary embodiment of the present inventive concept.
Figure 5D:
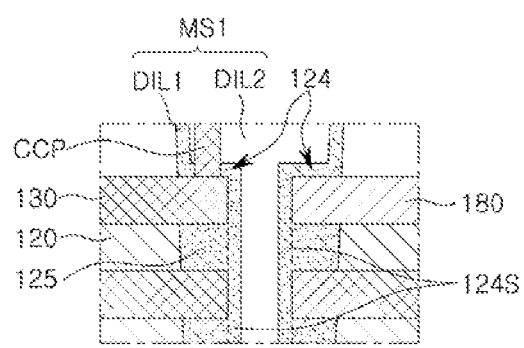
FIG. 5D is an enlarged cross-sectional diagram illustrating a region C of FIG. 5A according to an exemplary embodiment of the present inventive concept.
Figures 5E, 5F:
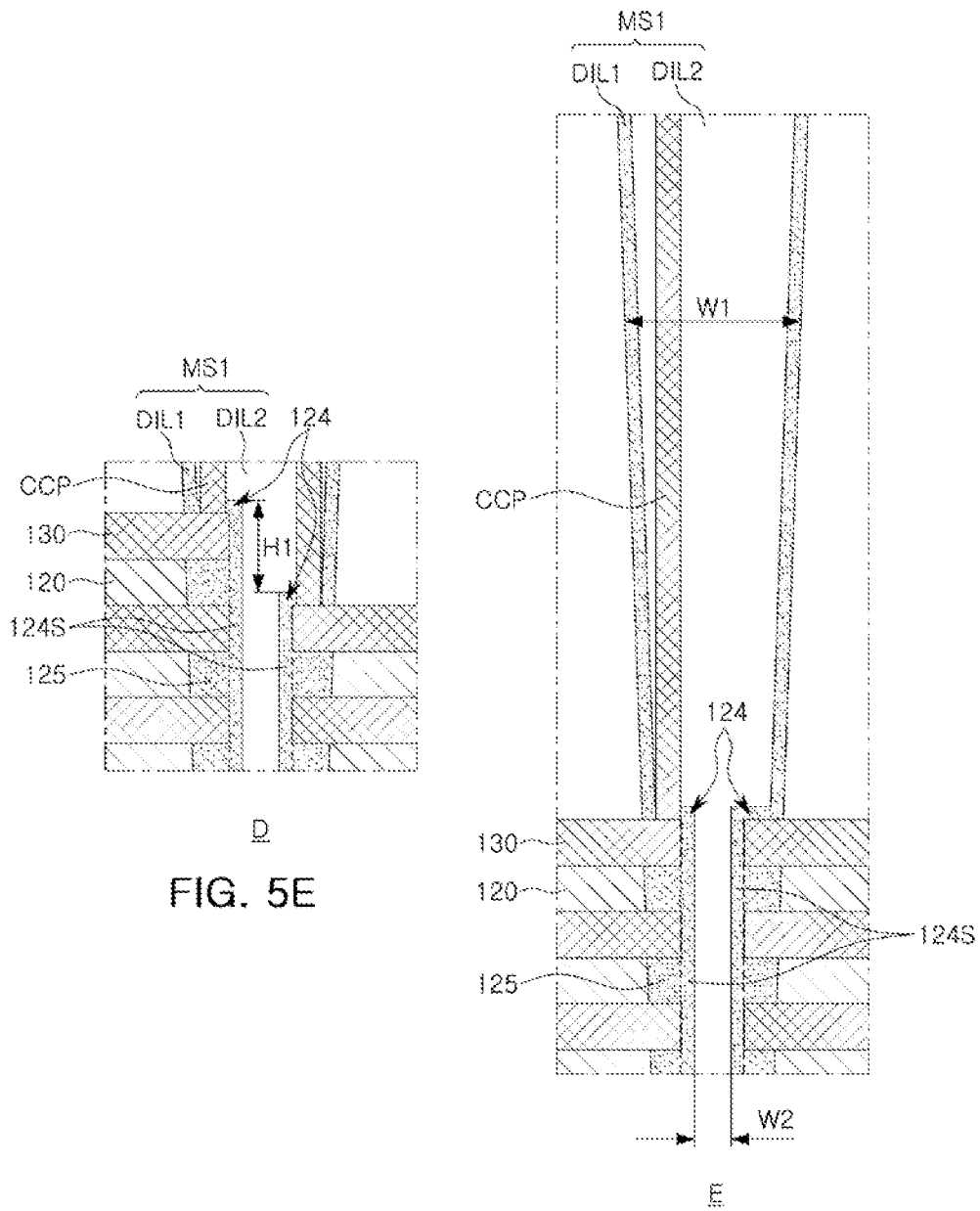
FIG. 5E is an enlarged cross-sectional diagram illustrating a region D of FIG. 5A according to an exemplary embodiment of the present inventive concept.
FIG. 5F is an enlarged cross-sectional diagram illustrating a region E of FIG. 5A according to an exemplary embodiment of the present inventive concept.

FIG. 3 is a plan diagram illustrating a semiconductor device according to an exemplary embodiment of the present inventive concept. In FIG. 3, some configurations of a semiconductor device 100 are illustrated for understanding. FIG. 4 is an enlarged diagram illustrating a region A of FIG. 3 according to an exemplary embodiment of the present inventive concept. FIG. 5A is a cross-sectional diagram illustrating a cross-sectional surface of the semiconductor device of FIG. 4 taken along line I-I', according to an exemplary embodiment of the present inventive concept. FIG. 5B is a cross-sectional diagram illustrating a cross-sectional surface of the semiconductor device of FIG. 4 taken along line II-II', according to an exemplary embodiment of the present inventive concept. FIG. 5C is an enlarged cross-sectional diagram illustrating a region B of FIG. 5A according to an exemplary embodiment of the present inventive concept. FIG. 5D is an enlarged cross-sectional diagram illustrating a region C of FIG. 5A according to an exemplary embodiment of the present inventive concept. FIG. 5E is an enlarged cross-sectional diagram illustrating a region D of FIG. 5A according to an exemplary embodiment of the present inventive concept. FIG. 5F is an enlarged cross-sectional diagram illustrating a region E of FIG. 5A according to an exemplary embodiment of the present inventive concept.

Referring to FIGS. 3 to 5B, the semiconductor device 100 may include a substrate 101 having a cell array region CAR and a pad region PAD, a stack structure GS including gate electrodes 130 and mold insulating layers 120 alternately stacked on the substrate 101, channels CH penetrating the stack structure GS, first and second separation regions MS1 and MS2 penetrating the stack structure GS, and cell contact plugs CCP penetrating the first separation regions MS1.

The first and second separation regions MS1 and MS2 may extend in a first direction (an x direction), and may be disposed side by side and may be spaced apart from each other in a second direction (a y direction). The first and second separation regions MS1 and MS2 may be disposed in parallel to each other. The second separation regions MS2 may include second central separation regions MS2a extending from the cell array region CAR to the pad region PAD, and second auxiliary separation regions MS2b extending in the cell array region CAR and partially spaced apart from each other in the first direction in the pad region PAD. Portions of the first separation regions MS1 may be disposed between the second auxiliary separation regions MS2b in the pad region PAD. The first separation regions MS1 may only be disposed in the pad region PAD, and each of the first separation regions MS1 may have a length shorter than a length of each of the second central separation regions MS2a in the first direction, but the inventive concept is not limited thereto.

The cell array region CAR may be divided into a plurality of memory blocks by the second central separation regions MS2a. The stack structure GS may be divided into a plurality of regions by the second separation regions MS2.

The second auxiliary separation regions MS2b may be disposed between the second central separation regions MS2a in the cell array region CAR. The first separation regions MS1 and the second auxiliary separation regions MS2b may be alternately disposed, and disposed side by side with a certain gap therebetween in the second direction in the pad region PAD. A gap between the first and second separation regions MS1 and MS2, and an arrangement order and the number of the first and second separation regions MS1 and MS2 are not limited to the example illustrated in FIG. 3, and may be varied. For example, a gap between the first separation regions MS1 and the second separation regions MS2 may not be constant, and the first separation regions MS1 and the second separation regions MS2 may not be alternately disposed. The number of the first separation regions MS1 may be the same as the number of the second separation regions MS2, or the number of the first separation regions MS1 may be greater than or less than the number of the second separation regions MS2.

Referring to FIGS. 5A and 5B, the semiconductor device 100 may include a stack structure GS in which the mold insulating layers 120 and the gate electrodes 130 are alternately stacked on the substrate 101, the first and second separation regions MS1 and MS2 dividing the stack structure GS into a plurality of regions, the channels CH, dummy channels DCH, cell contact plugs CCP, and a wiring layer 190. The semiconductor device 100 may further include an interlayer insulating layer 60 covering the stack structure GS, a first capping insulating layer 70 covering the interlayer insulating layer 60, and a second capping insulating layer 80. The channels CH may include a channel region 140, a channel insulating layer 145, a gate dielectric layer, and the like. The wiring layer 190 may include a lower wiring layer 150, an intermediate wiring layer 160, and an upper wiring layer 170, which will be described in more detail below.

The substrate 101 may have an upper surface extending in the first direction and the second direction. The substrate 101 may include a semiconductor material such as a IV group semiconductor, a III-V group compound semiconductor, or a II-VI group oxide semiconductor. A IV group semiconductor may include, for example, silicon, germanium, or silicon-germanium. The substrate 101 may be provided as a bulk wafer or an epitaxial layer.

The cell array region CAR of the substrate 101 may be a region in which the gate electrodes 130 may be stacked vertically and the channels CH may be disposed, and the cell array region CAR may correspond to the memory cell array 20 illustrated in FIG. 1. The pad region PAD may be a region in which the gate electrodes 130 may extend at different lengths, and the pad region PAD may electrically connect the memory cell array 20 illustrated in FIG. 1 to the peripheral circuit 30. The pad region PAD may be disposed on at least one end of the cell array region CAR in one direction, e.g., in the second separation regions MS2.

The gate electrodes 130 may be stacked and spaced apart from one another in a third direction (a z direction), and the gate electrodes 130 may extend to the pad region PAD from the cell array region CAR at different lengths. The gate electrodes 130 may include a lower gate electrode included in gates of the ground selection transistor GST illustrated in FIG. 2, memory gate electrodes included in the plurality of memory cells MC, and upper gate electrodes included in gates of the string selection transistors SST1 and SST2. The number of memory gate electrodes included in the memory cells MC may be determined in accordance with a capacity of the semiconductor device 100. In an exemplary embodiment of the present inventive concept, the number of the upper and lower gate electrodes of each of the string selection transistors SST1 and SST2 and the ground selection transistor GST may be one or two, and the upper and lower gate electrodes may have a structure the same as or different from a structure of the memory gate electrodes of the memory cells MC. Some of the gate electrodes 130, e.g., memory gate electrodes adjacent to the upper gate electrodes or the lower gate electrode, may be dummy gate electrodes.

The mold insulating layers 120 may be disposed between the gate electrodes 130. The mold insulating layers 120 may be stacked and spaced apart from each other in the third direction of the substrate 101, and may extend in the second direction.

The mold insulating layers 120 and the gate electrodes 130 may extend at different lengths in the first direction and may form stepped portions in a staircase shape in the pad region PAD of the substrate 101. Portions of the stack structure GS may extend at different lengths in the first direction and the second direction, and may form pads forming stepped portions in a pyramid form in the pad region PAD of the substrate 101. The number of the stepped portions of the pads is not limited to the example illustrated in the diagram, and may be varied.

Portions of the gate electrodes 130 included in the pad may be dummy gate electrodes 130a. The dummy gate electrodes 130a may not be in contact with the channels CH. In the pad region PAD, the gate electrodes 130 and the dummy gate electrodes 130a may be connected to cell contact plugs CCP, and accordingly, the gate electrodes 130 may be connected to the wiring layer 190.

The gate electrodes 130 may include a metal material, such as tungsten (W). In exemplary embodiments of the present inventive concept, the gate electrodes 130 may include polycrystalline silicon or a metal silicide material. In exemplary embodiments of the present inventive concept, the gate electrodes 130 may further include a diffusion barrier, and the diffusion barrier may include tungsten nitride (WN), tantalum nitride (TaN), titanium nitride (TiN), or combinations thereof. The mold insulating layers 120 may include an insulating material such as silicon oxide or silicon nitride.

The interlayer insulating layer 60 may cover the substrate 101, and the stack structure GS on the substrate 101. The interlayer insulating layer 60 may include an insulating material such as silicon oxide or silicon nitride.

The channels CH may form rows and columns on the cell array region CAR and may be spaced apart from one another. The channels CH may be disposed in lattice form or may be disposed in a zigzag form in one direction. Each of the channels CH may have a cylindrical shape, and may have an inclined side surface of which a width decreases towards the substrate 101 depending on an aspect ratio. In exemplary embodiments of the present inventive concept, the channels CH may have a "U" shaped form in which lower portions of the channels CH are connected to one another. In exemplary embodiments of the present inventive concept, the dummy channels DCH may also be disposed on end portions of the cell array region CAR adjacent to the pad region PAD and in the pad region PAD. The dummy channels DCH may have a structure the same as or similar to a structure of the channels CH, and may not perform any substantial function in the semiconductor device 100.

The channel region 140 may be disposed in the channels CH. The channel region 140 in the channels CH may have an annular form surrounding the channel insulating layer 145, but the inventive concept is not limited thereto. In an exemplary embodiment of the present inventive concept, the channel region 140 may have a columnar shape such as a cylindrical shape or a prism shape. The channel region 140 may include a semiconductor material such as polycrystalline silicon or single crystalline silicon, and the semiconductor material may be an undoped material or a material including p-type or n-type impurities.

Channel pads 146 may be disposed on the channel region 140 in the channels CH. The channel pads 146 may cover an upper surface of the channel insulating layer 145 and may be electrically connected to the channel region 140. The channel pads 146 may include doped polycrystalline silicon, for example.

The gate dielectric layer may be disposed between the gate electrodes 130 and the channel region 140. The gate dielectric layer may include a tunneling layer, an electric charge storage layer, and a blocking layer, layered in order from the channel region 140. The tunneling layer may tunnel electric charge to the electric charge storage layer, and may include silicon oxide ($SiO_2$), silicon nitride ($Si_3N_4$), silicon oxynitride (SiON), or combinations thereof. The electric charge storage layer may be an electric charge trapping layer or a floating gate conductive layer. The blocking layer may include silicon oxide ($SiO_2$), silicon nitride ($Si_3N_4$), silicon oxynitride (SiON), a high-k material, or combinations thereof. In exemplary embodiments of the present inventive concept, at least a portion of the gate dielectric layer may extend in a horizontal direction along the gate electrodes 130.

As illustrated in FIG. 5A, the first and second separation regions MS1 and MS2 may penetrate the gate electrodes 130, the mold insulating layers 120, and the interlayer insulating layer 60, stacked on the substrate 101, in the third direction perpendicular to the upper surface of the substrate 101, and may be in contact with the substrate 101. Accordingly, the first and second separation regions MS1 and MS2 may penetrate the stack structure GS and may be in contact with the substrate 101.

Each of the first and second separation regions MS1 and MS2 may have an inclined side surface of which a width of a lower portion decreases more than a width of an upper portion towards the substrate 101 depending on an aspect ratio. For example, referring to FIG. 5F, an upper portion of each of the first separation regions MS1 may have a first width, and a lower portion of each of the first separation regions MS1 may have a second width. The first width may be greater than the second width.

The first separation regions MS1 may be disposed side by side and may be spaced apart from one another between the second separation regions MS2. Each of the first separation regions MS1 may have a width greater than a width of each of the second separation regions MS2 in the second direction. An internal space of each of the first separation regions MS1 may be filled with first dummy insulating layers DIL1 and second dummy insulating layers DIL2, but the inventive concept is not limited thereto. For example, an internal space of each of the first separation regions MS1 may include a single layer including an insulating material different from a material of the interlayer insulating layer 60. The first dummy insulating layers DIL1 may be disposed on both inclined side walls of the first separation regions MS1, may extend in the third direction, may be in contact with the substrate 101, and may also extend in the first direction. The second dummy insulating layers DIL2 may be disposed between the first dummy insulating layers DILL may extend in the third direction, may be in contact with the substrate 101, and may also extend in the first direction. The first dummy insulating layers DIL1 and second dummy insulating layers DIL2 may include different materials.

Upper surfaces of the second separation regions MS2 may be disposed on a level higher than upper surfaces of the first separation regions MS1, and may be disposed on a level higher than upper surfaces of the dummy channels DCH.

Referring to FIG. 5B, the line II-II' may cut the semiconductor device 100 in the first direction in which the first separation regions MS1 extend in the pad region PAD, and may penetrate and cut the channels CH in the cell array region CAR. As illustrated in FIG. 5B, the semiconductor device 100 may include the gate electrodes 130, the mold insulating layers 120, horizontal portions 124, side portions 124S, extending portions 125, the interlayer insulating layer 60, the cell contact plugs CCP, the second dummy insulating layers DIL2, and the like. In a portion of the pad region PAD in which the first separation regions MS1 are disposed, a space between the gate electrodes 130 may be filled with the extending portions 125 instead of the mold insulating layers 120. The extending portions 125 may be connected to the side portions 124S extending from the horizontal portions 124 covering a portion of an upper surface of each of the gate electrodes 130. The side portions 124S may extend from the horizontal portions 125 towards the upper surface of the substrate 101.

The cell contact plugs CCP may penetrate the horizontal portions 124 and may be in contact with the gate electrodes 130 on end portions of the gate electrodes 130.

FIG. 5C illustrates an arrangement structure of the extending portions 125.

Referring to FIG. 5C, the extending portions 125 may be disposed adjacent to the first separation regions MS1. One end of the extending portions 125 may be in contact with external side surfaces of the first dummy insulating layers DIL1 in the second direction, and the other end of the extending portions 125 may be in contact with the mold insulating layers 120 in the second direction. A thickness of each of the extending portions 125 taken in the third direction may be substantially the same as a thickness of each of the mold insulating layers 120 taken in the third direction. The first dummy insulating layers DIL1 may extend in the third direction, and may be in contact with the interlayer insulating layer 60. The extending portions 125 may be layers covering a region between the gate electrodes 130 and side walls of the mold insulating layers 120 and in contact with the first dummy insulating layers DIL1. The horizontal portions 124 may be layers on upper surfaces of uppermost gate electrodes 130, and may be portions of the first dummy insulating layers DIL1. The side portions 124S may be layers on side surfaces of the gate electrodes 130, and may be portions of the first dummy insulating layers DIL1.

The extending portions 125 may be spaced apart from one another with the first separation regions MS1 interposed therebetween in the second direction, and partial regions of the extending portions 125 may be spaced apart from one another with the gate electrodes 130 interposed therebetween in the third direction. The extending portions 125 may be configured to be surrounded by the first dummy insulating layers DILL the mold insulating layers 120, the gate electrodes 130, and the second dummy insulating layers DIL2.

The extending portions 125 may extend from the side portions 124S towards the mold insulating layers 120 from the first dummy insulating layers DIL1 in the second direction. Accordingly, the first dummy insulating layers DIL1 and the extending portions 125 max have serrations or may have a fishbone form. The first dummy insulating layers DIL1 and the extending portions 125 may work as a support stand to prevent collapse of the mold insulating layers 120.

Positions of one end of the extending portions 125 may be different from one another in the second direction. As a width of each of the first separation regions MS1 taken in the second direction decreases towards the substrate 101, the closer the extending portions 125 are to the substrate 101, and the shorter the distance is between the extending portions 125 in the second direction. Accordingly, a width of each of the extending portions 125 taken in the second direction may decrease. For example, the extending portions 125 may include a first extending portion 125-1 and a second extending portion 125-2, and the second extending portion 125-2 may be disposed closer to the substrate 101 than the first extending portion 125-1, and one end on which the second extending portion 125-2 opposes the mold insulating layers 120 in the second direction may be different from one end on which the first extending portion 125-1 opposes the mold insulating layers 120 in the second direction.

The extending portions 125 may be formed of a material different from materials of the mold insulating layers 120 and the gate electrodes 130, and may be formed of a material the same as a material of the first dummy insulating layers DILL For example, the first dummy insulating layers DIL1 and the extending portions 125 may include aluminum oxide ($Al_2O_3$), but the inventive concept is not limited thereto.

In exemplary embodiments of the present inventive concept, as the extending portions are disposed on etched ends of the mold insulating layers 120, a length of each of the mold insulating layers 120 in the second direction may decrease. Accordingly, during a gate replacement process, supporting force of the dummy channels DCH in contact with the mold insulating layers 120 may improve such that collapse of the mold insulating layers 120 may be prevented, and a bridge defect may be reduced.

A portion of the stack structure GS may include regions which are not connected to the second separation regions MS2. Accordingly, portions of sacrificial layers 180 may not be selectively removed with respect to the mold insulating layers 120 during a gate replacement process, and at least one region in which the sacrificial layers 180 remain may be present in the semiconductor structure. For example, the sacrificial layers 180 disposed on an uppermost end, between the first separation regions MS1 and the second separation regions MS2 and not penetrated by the second separation regions MS2, may remain.

The sacrificial layers 180 may be disposed on substantially the same level as the upper gate electrodes of the gate electrodes 130 connected to the cell contact plugs CCP, and one end of the sacrificial layers 180 may be surrounded by the first dummy insulating layers DILL the second dummy insulating layers DIL2, and the extending portions 125. The sacrificial layers 180 may be disposed between the horizontal portions 124 and the extending portions 125, and may include a material different from a material of the gate electrodes 130.

FIG. 5D illustrates the region C in which the cell contact plugs CCP of the semiconductor device 100 are in contact with the gate electrodes 130 according to an exemplary embodiment of the present inventive concept.

The upper gate electrodes of the gate electrodes 130 may be in contact with the cell contact plugs CCP and may be used to electrically connect the wiring layer 190 to the memory cells MC. The extending portions 125 may be disposed below the upper gate electrodes.

The first dummy insulating layers DIL1 may include the horizontal portions 124 covering upper surfaces of the upper gate electrodes, the side portions 124S extending from the horizontal portions 124 towards the upper surface of the substrate 101, and the extending portions 125 extending from the side Portions 124S towards the mold insulating layers 120 in the second direction. Accordingly, portions of the first dummy insulating layers DIL1 may include the horizontal portions 124 disposed substantially in parallel to the upper surface of the substrate 101. The horizontal portions 124 may be in contact with the second dummy insulating layers DIL2. The horizontal portions 124 may provide a contact region connecting an upper wiring to the gate electrodes 130, and may be penetrated by the cell contact plugs CCP in the third direction. The cell contact plugs CCP may be disposed in the first separation regions MS1, may penetrate the second separation regions MS2 in the third direction, may penetrate the horizontal portions 124 in the third direction, and may be in contact with the upper gate electrodes.

The horizontal portions 124 may include a material different from a material of the mold insulating layers 120, and may include a material the same as a material of the extending portions 125. As a material of the horizontal portions 124, an insulating material having an etch selectivity different from an etch selectivity of the second separation regions MS2 and the mold insulating layers 120 may be selected under certain conditions. For example, the horizontal portions 124 may include aluminum oxide ($Al_2O_3$), but the inventive concept is not limited thereto. As the horizontal portions 124 includes a material in consideration of etch selectivity, during an etching process for forming the cell contact plugs CCP, an etching speed in the horizontal portions 124 may be slower than an etching speed in the second dummy insulating layers DIL2. Accordingly, a depth of a contact region of the cell contact plugs CCP may be adjusted. As a depth of the contact region of the cell contact plugs CCP is adjusted, the cell contact plugs CCP and a through wiring may be formed in the same process.

As the semiconductor device 100 includes the extending portions 125 and the horizontal portions 124, a punching defect in which the cell contact plugs CCP are in contact with lower gate electrodes of the gate electrodes 130 disposed below the upper gate electrodes may be prevented.

The horizontal portions 124, the side portions 124S, and the extending portions 125 of the first dummy insulating layer DIL1 may be configured to surround one end of the upper gate electrodes 130, and the extending portions 125 may be contacted by an external side surface of the first dummy insulating layer DIL1. In an exemplary embodiment of the present inventive concept, when the first dummy insulating layer DIL1 extending in the third direction, the horizontal portions 124, which are a portion of the first du-n insulating layer DIL1, and the extending portions 125 extending towards the mold insulating layers 120 from the external side surface of the first dummy insulating layer DIL1 are formed of the same material, the first dummy insulating layer DIL1, the horizontal portions 124, and the extending portions 125 may be included in and referred to as a first insulating layer.

FIG. 5E illustrates the region D of the semiconductor device 100 in which the plurality of cell contact plugs CCP are in contact with the plurality of gate electrodes 130, respectively. FIG. 5E particularly illustrates cross-sectional surfaces of the first separation regions MS1, including a boundary surface on which stepped portions of pads are present, in the pad region PAD.

As stepped portions of the upper gate electrodes are present in the pad region PAD, there may be a difference in heights among the horizontal portions 124 covering the upper gate electrodes. A height difference H1 of the horizontal portions 124 in the third direction may be substantially the same as a height of each of the stepped portions of the gate electrodes 130, and accordingly, the height difference H1 may be substantially the same as a sum of a first thickness of a single gate electrode 130 taken in the third direction and a second thickness of a single mold insulating layer 120 taken in the third direction.

The semiconductor device 100 may include at least one first separation region MS1 including two cell contact plugs CCP. Each of the cell contact plugs CCP may penetrate the second dummy insulating layers DIL2, may penetrate the horizontal portions 124, and may be electrically connected to the gate electrodes 130. For example, the cell contact plugs CCP may penetrate one of the second dummy insulating layers DIL2, may include first and second cell contact plugs having different heights in the third direction, and may be electrically connected to the gate electrodes 130, respectively. A difference in heights between the first and second cell contact plugs may be substantially the same as a sum of a first thickness of a single gate electrode 130 taken in the third direction and a second thickness of a single mold insulating layer 120 taken in the third direction.

The first separation regions MS1 may include upper first separation regions in contact with the interlayer insulating layer 60 and lower first separation regions in contact with the stack structure GS. Each of the upper first separation regions may have a first width W1 in the second direction, and the lower first separation regions may have a second width W2 in the second direction. The first width W1 may be greater than the second width W2. A minimum value of the first width W1 may be greater than a maximum value of the second width W2.

Figure 6A:
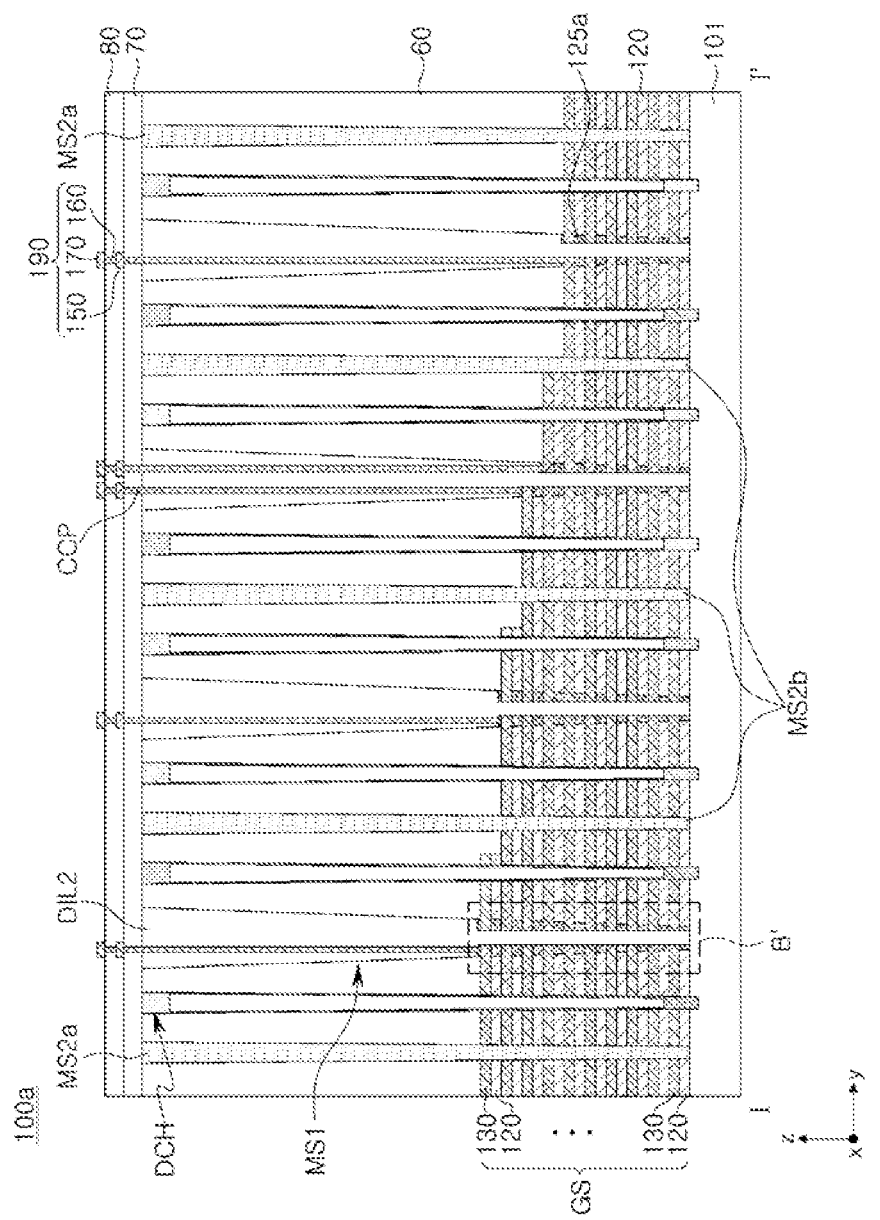
FIG. 6A is a cross-sectional diagram illustrating a semiconductor device according to an exemplary embodiment of the present inventive concept.

FIG. 6A is a cross-sectional diagram illustrating a semiconductor device according to an exemplary embodiment of the present inventive concept.

Figure 6B:
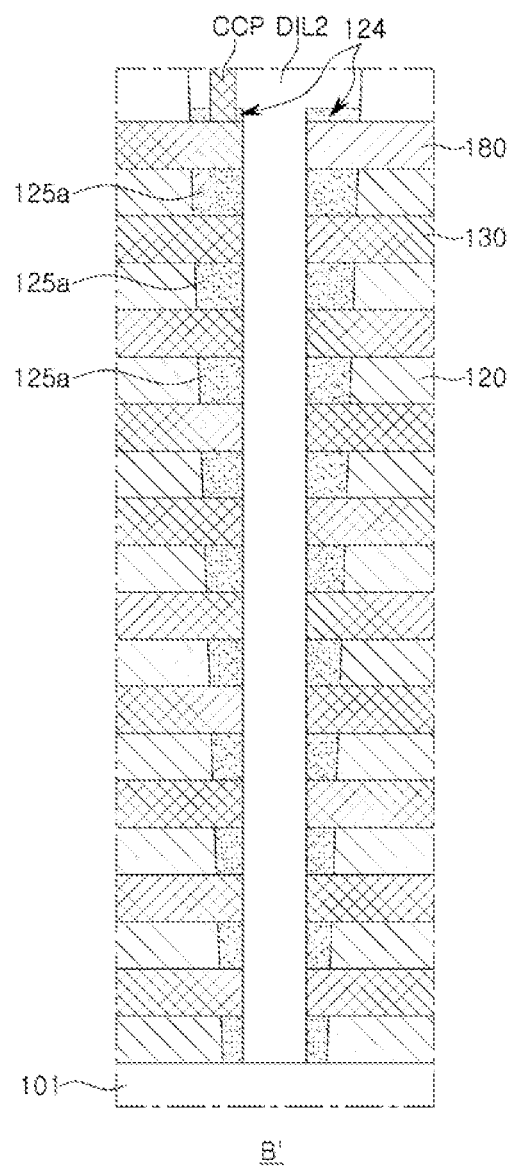
FIG. 6B is an enlarged diagram illustrating a region B' of FIG. 6A according to an exemplary embodiment of the present inventive concept.

FIG. 6B is an enlarged diagram illustrating a region B' of FIG. 6A according to an exemplary embodiment of the present inventive concept.

Referring to FIGS. 6A and 6B, in a semiconductor device 100a, an internal space of the first separation regions MS1 may be filled with the second dummy insulating layers DIL2. Accordingly, in comparison with FIG. 5A, as the first separation regions MS1 do not include the first dummy insulating layers DIL1 a configuration of an insulating layer may be different. Each of the second separation regions MS2 may have an inclined side surface of which a width of a lower portion is less than a width of an upper portion depending on an aspect ratio.

Extending portions 125a may be disposed adjacent to the first separation regions MS1, one end of the extending portions 125a may be in contact with the second dummy insulating layers DIL2 in the second direction, and the other end of the extending portions 125a may be in contact with the mold insulating layers 120 in the second direction. A thickness of each of the extending portions 125a taken in the third direction may be substantially the same as a thickness of each of the mold insulating layers 120 taken in the third direction. The extending portions 125a may be spaced apart from one another with the first separation regions MS1 interposed therebetween in the second direction, and may be spaced apart from one another with gate electrodes 130 interposed therebetween in the third direction. The extending portions 125a may be configured to be surrounded by the second dummy insulating layers DIL2, the mold insulating layers 120, and the gate electrodes 130.

The extending portions 125a may include a material different from a material of the mold insulating layers 120, and may include a material the same as a material of the horizontal portions 124. As a material of the extending portions 125a, an insulating material having an etch selectivity different from an etch selectivity of the second dummy insulating layers DIL2 and the mold insulating layers 120 may be selected under certain conditions. For example, the extending portions 125a may include aluminum oxide ($Al_2O_3$), but the inventive concept is not limited thereto.

The semiconductor device 100a may further include the horizontal portions 124 covering a portion of an upper surface of each of upper gate electrodes of the gate electrodes 130. The horizontal portions 124 may be in contact with the second dummy insulating layers DIL2. The horizontal portions 124 may provide a contact region connecting an upper wiring to the gate electrodes 130, and may be penetrated by the cell contact plugs CCP in the third direction.

The horizontal portions 124 may include a material different from a material of the mold insulating layers 120, and may include a material the same as a material of the extending portions 125a. As a material of the horizontal portions 124, an insulating material having an etch selectivity different from an etch selectivity of the second dummy insulating layers DIL2 and the mold insulating layers 120 may be selected under certain conditions. For example, the horizontal portions 124 may include aluminum oxide ($Al_2O_3$), but the inventive concept is not limited thereto. As the horizontal portions 124 includes a material in consideration of etch selectivity, during an etching process for forming the cell contact plugs CCP, an etching speed in the horizontal portions 124 may be slower than an etching speed in the second dummy insulating layers DIL2. Accordingly, a depth of the contact region of the cell contact plugs CCP may be adjusted. As a depth of the contact region of the cell contact plugs CCP is adjusted, the cell contact plugs CCP and a through wiring may be formed in the same process.

Figure 7A:
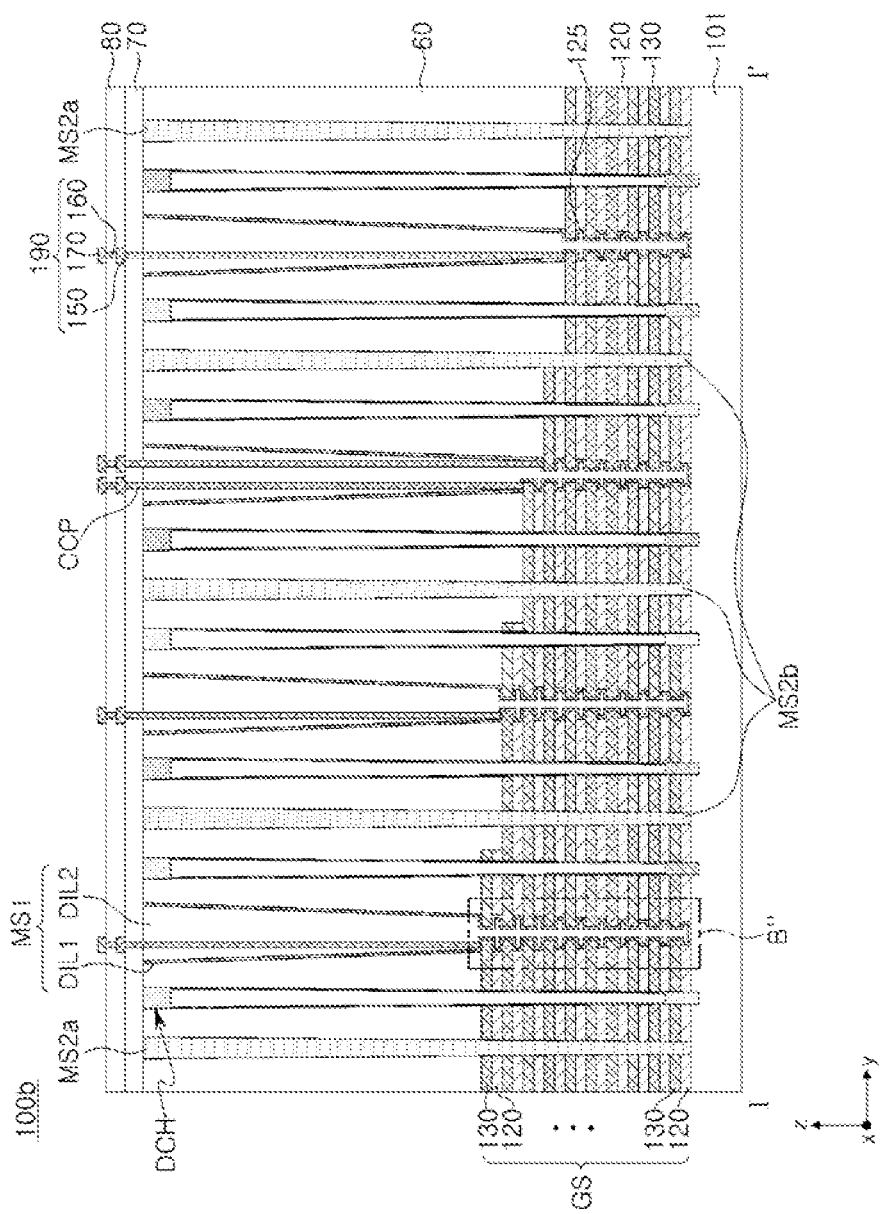
FIG. 7A is a cross-sectional diagram illustrating a semiconductor device according to an exemplary embodiment of the present inventive concept.

FIG. 7A is a cross-sectional diagram illustrating a semiconductor device according to an exemplary embodiment of the present inventive concept.

Figure 7B:
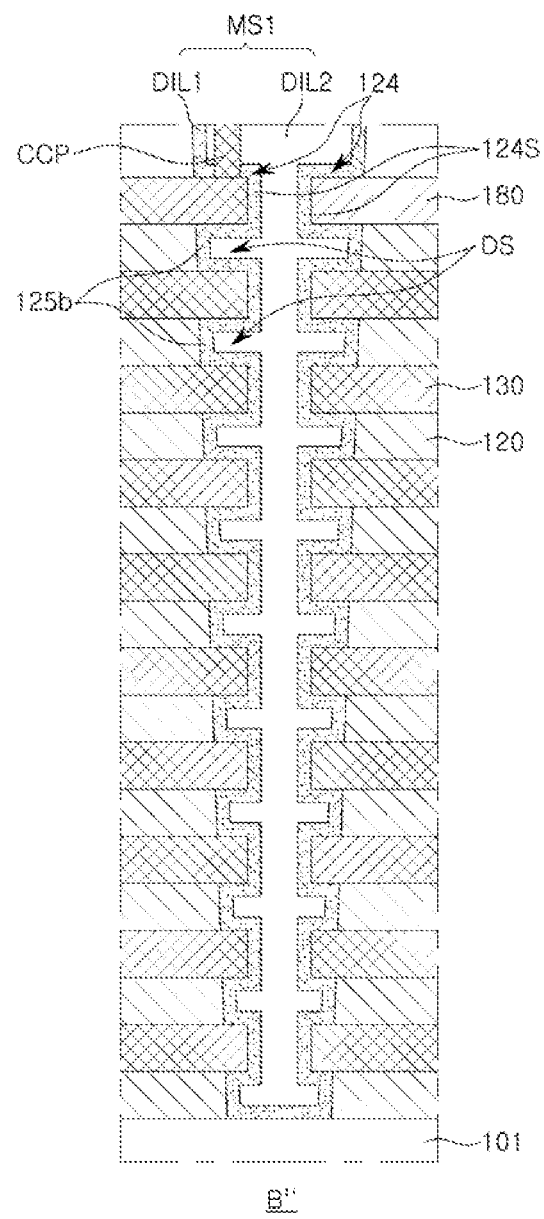
FIG. 7B is an enlarged diagram illustrating a region B" of FIG. 7A according to an exemplary embodiment of the present inventive concept.

FIG. 7B is an enlarged diagram illustrating a region B" of FIG. 7A according to an exemplary embodiment of the present inventive concept.

Referring to FIGS. 7A and 7B, in a semiconductor device 100b, first separation regions MS1 may include first dummy insulating layers DIL1 and second dummy insulating layers DIL2, and each of the first dummy insulating layers DIL1 and the second dummy insulating layers DIL2 may have a shape different from the example embodiment illustrated in FIGS. 5A and 5C.

In exemplary embodiments of the present inventive concept, each of extending portions 125b may have a recess portion DS. The extending portions 125b may uniformly extend along upper and lower surfaces of the gate electrodes 130 such that the recess portion DS may be disposed between the gate electrodes 130 disposed upwardly and downwardly. A thickness of the recess portion DS taken in the third direction may be less than a thickness of each of the extending portions 125b taken in the third direction, and a width of the recess portion DS taken in the second direction may be less than a width of each of the extending portions 125b taken in the second direction. The recess portion DS may extend in the first direction, and an internal space of the recess portion DS may be filled with the second dummy insulating layers DIL2. Due to the recess portion DS of the extending portions 125b, the first dummy insulating layers DIL1 and the extending portions 125b may form serrations. The first dummy insulating layers DIL1 and the extending portions 125b may be configured to surround one end of the gate electrodes 130.

FIGS. 7A and 7B illustrate an exemplary embodiment in which a shape of each of the extending portions (e.g., 125b) is different from the aforementioned exemplary embodiments, and a shape of each of the extending portions is not limited to the exemplary embodiment illustrated in FIGS. 7A and 7B. For example, a cross-sectional surface of each of the extending portions may have a square shape, a rectangular shape, a trapezoid shape, a triangular shape, a semi-circular shape, or the like, and a cross-sectional surface of the recess portion DS may have a square shape, a rectangular shape, a trapezoid shape, a triangular shape, a semi-circular shape, or the like.

Figure 8A:
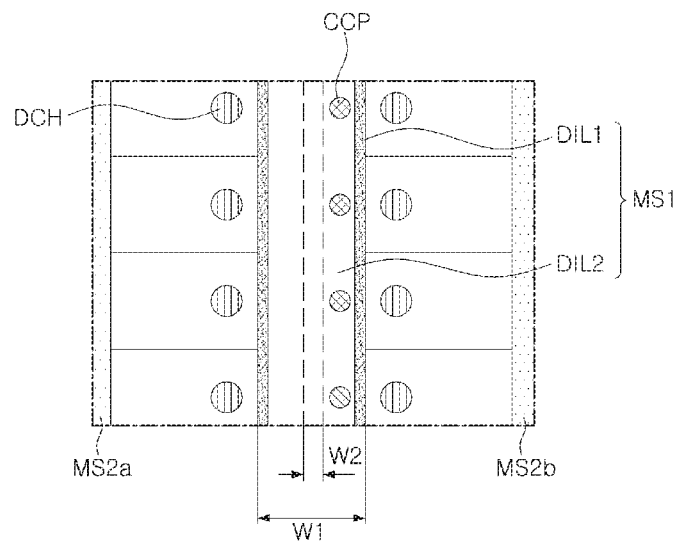
FIGS. 8A and 8B are plan diagrams illustrating an arrangement relationship between dummy channels and cell contact plugs of a semiconductor device according to exemplary embodiments of the present inventive concept.
Figure 8B:
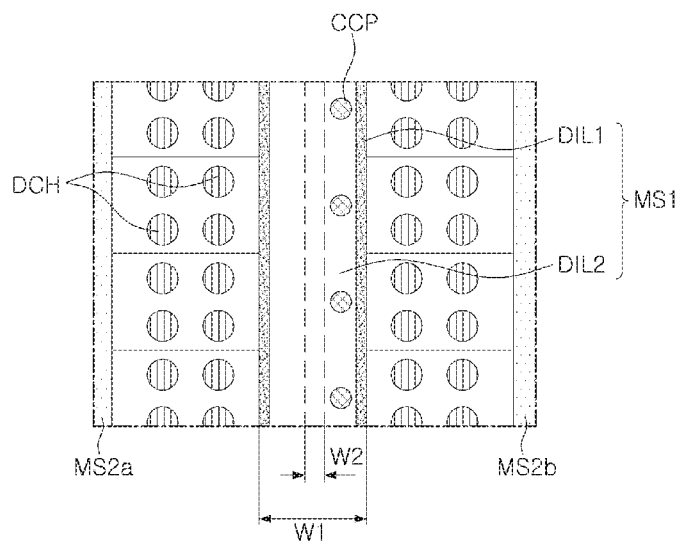

FIGS. 8A and 8B are plan diagrams illustrating an arrangement relationship between dummy channels and cell contact plugs of a semiconductor device according to exemplary embodiments of the present inventive concept.

Each of the upper first separation regions may have the first width W1 in the second direction, and the lower first separation regions may have the second width W2 in the second direction. The first width W1 may be greater than the second width W2.

The cell contact plugs CCP may be disposed in the first separation regions MS1, and a plurality of the dummy channels DCH may be disposed between the first separation regions MS1 and the second separation regions MS2. For example, as illustrated in FIG. 8A, one dummy channel DCH may be disposed in each section, and as illustrated in FIG. 8B, four dummy channels DCH may be disposed in each section. In an exemplary embodiment of the present inventive concept, as the cell contact plugs CCP are disposed in the first separation regions MS1, the cell contact plugs CCP and the dummy channels DCH may be spaced apart from each other with the first dummy insulating layer DIL1 interposed therebetween. Accordingly, the dummy channels DCH may be disposed independently from the cell contact plugs CCP. Thus, the dummy channels DCH may be disposed relatively more densely. The number and an arrangement of the dummy channels DCH are not limited to the exemplary embodiments illustrated in FIGS. 8A and 8B, and may be varied.

Figure 9:
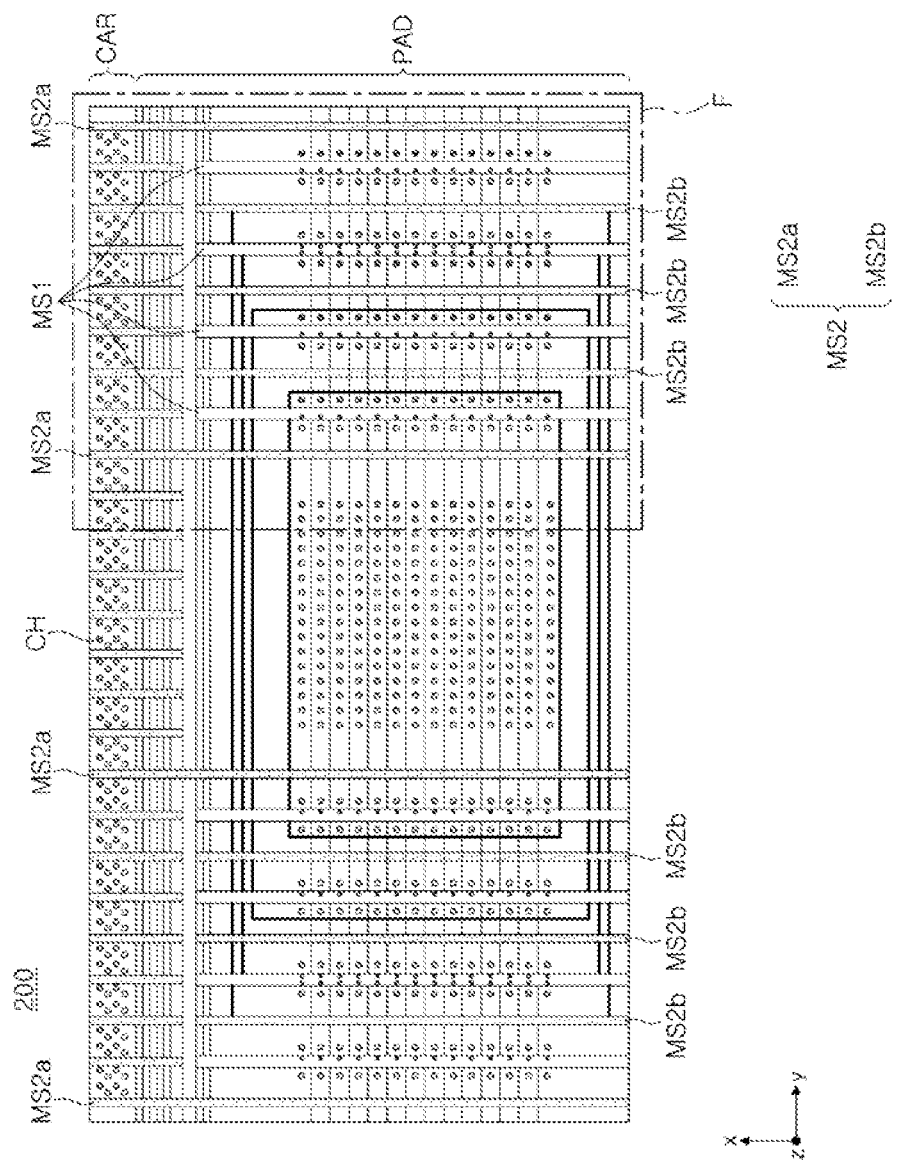
FIG. 9 is a plan diagram illustrating a semiconductor device according to an exemplary embodiment of the present inventive concept.
Figure 10:
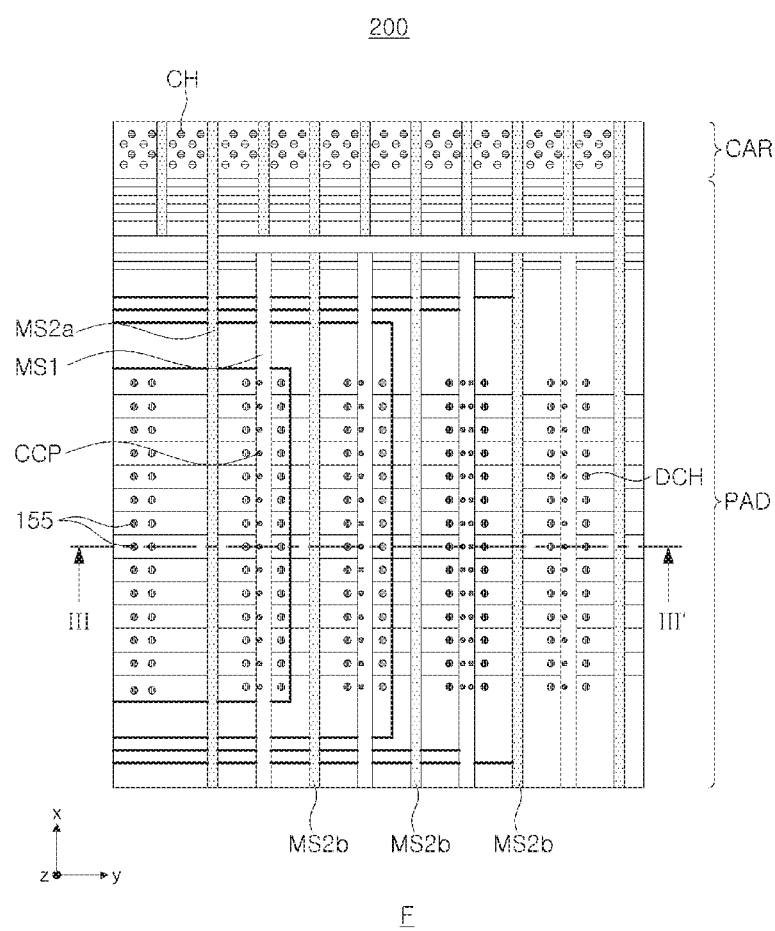
FIG. 10 is a plan diagram illustrating a region F of FIG. 9 according to an exemplary embodiment of the present inventive concept.
Figure 11:
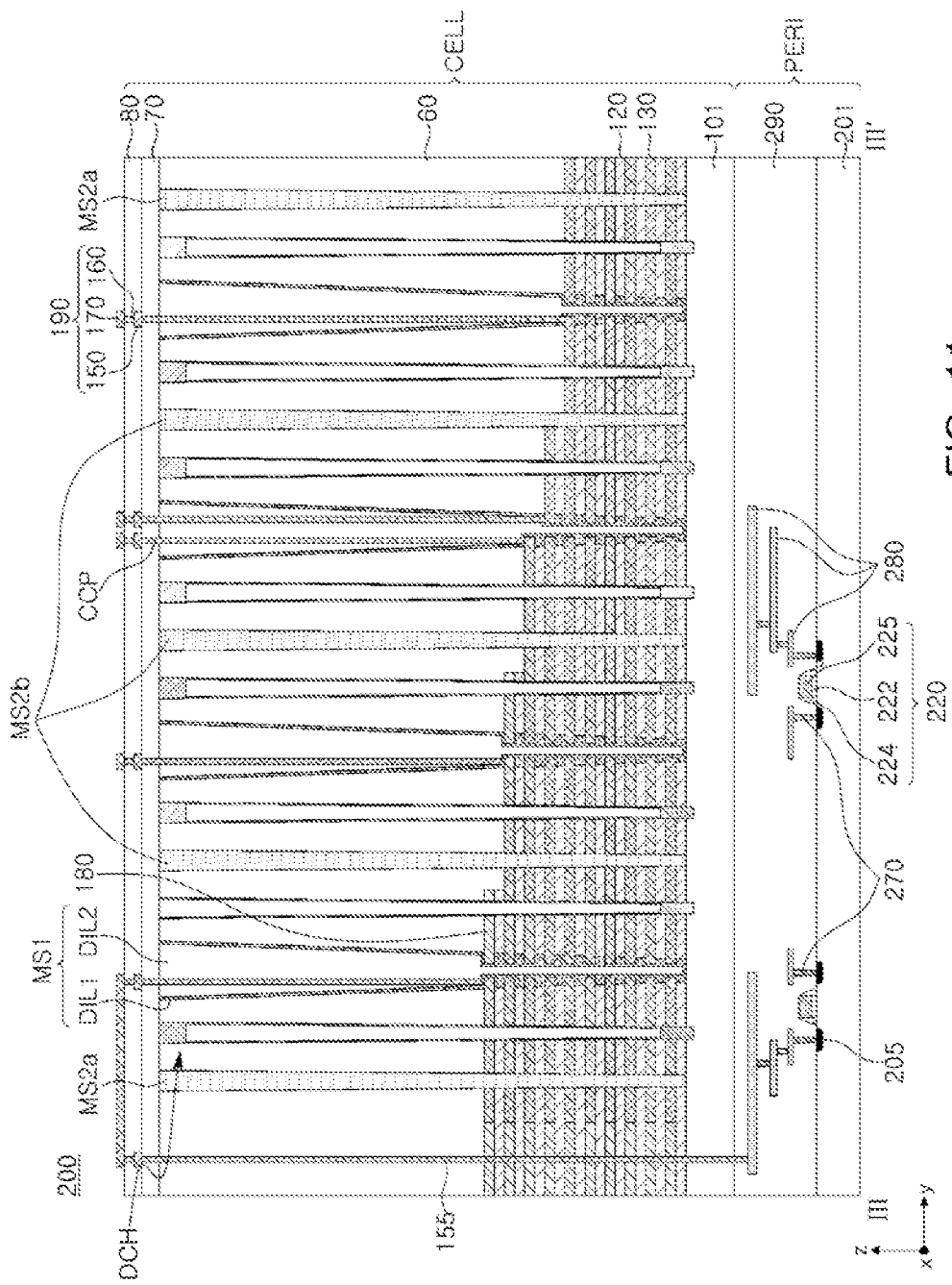
FIG. 11 is a cross-sectional diagram illustrating the semiconductor device of FIG. 10 taken along line III-III' according to an exemplary embodiment of the present inventive concept.

FIG. 9 is a plan diagram illustrating a semiconductor device according to an exemplary embodiment of the present inventive concept. FIG. 10 is a plan diagram illustrating a region F of FIG. 9 according to an exemplary embodiment of the present inventive concept. FIG. 11 is a cross-sectional diagram illustrating the semiconductor device of FIG. 10 taken along line III-III' according to an exemplary embodiment of the present inventive concept.

Referring to FIGS. 9 to 11, a semiconductor device 200 may include a memory cell region CELL and a peripheral circuit region PERI. The memory cell region CELL may be disposed on the peripheral circuit region PERI. Alternatively, in exemplary embodiments of the present inventive concept, the memory cell region CELL may be disposed below the peripheral circuit region PERI. The memory cell region CELL may include the substrate 101, the gate electrodes 130 disposed on the substrate 101, and the channels CH penetrating the gate electrodes 130. The peripheral circuit region PERI may include a base substrate 201, circuit elements 220 disposed on the base substrate 201, circuit contact plugs 270, and wiring lines 280.

The base substrate 201 may have an upper surface extending in the first direction and the second direction. The base substrate 201 may include element separation layers such that an active region may be defined. Source/drain regions 205 including impurities may be disposed in a portion of the active region. The base substrate 201 may include a semiconductor material such as a IV group semiconductor, a III-V group compound semiconductor, or a II-VI group oxide semiconductor.

The circuit elements 220 may include a planar transistor. Each of the circuit elements 220 may include a circuit gate insulating layer 222, a spacer layer 224, and a circuit gate electrode 225. The source/drain regions 205 may be disposed in the base substrate 201 on both sides of the circuit gate electrode 225.

A peripheral region insulating layer 290 may be disposed on the circuit elements 220 on the base substrate 201. The circuit contact plugs 270 may penetrate the peripheral region insulating layer 290 and may be connected to the source/drain regions 205. An electrical signal may be applied to the circuit elements 220 by the circuit contact plugs 270. In a region not illustrated in the diagram, the circuit contact plugs 270 may also be connected to the circuit gate electrode 225. The wiring lines 280 may be connected to the circuit contact plugs 270, and may be disposed as a plurality of layers.

The semiconductor device 200 may be manufactured by forming the peripheral circuit region PERI and the memory cell region CELL by forming the substrate 101 of the memory cell region CELL on an upper portion of the peripheral circuit region PERI. The substrate 101 may have a size that is substantially the same as a size of the base substrate 201, or may have a size smaller than a size of the base substrate 201.

The gate electrodes 130 in the pad region PAD may be electrically connected to the circuit elements 220 in the peripheral circuit region PERI through the wiring layers 190 and the cell contact plugs CCP. A through wiring 155 may connect the wiring layer 190 in the pad region PAD to the wiring lines 280 in the peripheral circuit region PERI.

The through wiring 155 may be disposed in a central region of the pad region PAD. The through wiring 155 may penetrate the interlayer insulating layer 60, the stack structure GS, the substrate 101 in the pad region PAD, and the peripheral region insulating layer 290, and the sacrificial layers 180 which are not substituted for tungsten (W) during a gate replacement process may be included in the stack structure GS.

As a depth of a contact region may be adjusted during an etching process for forming the cell contact plugs CCP, the cell contact plugs CCP and the through wiring 155 may be formed in the same process. Accordingly, while the same process is performed, the time in which the cell contact plugs CCP penetrates the horizontal portions 124 of the first dummy insulating layers DIL1 may be increased, and accordingly, the time in which the through wiring 155 penetrates the interlayer insulating layer 60, the stack structure GS, the substrate 101, and the peripheral region insulating layer 290 and is connected to the wiring lines 280 in the peripheral circuit region PERI may be secured.

FIGS. 12 to 24 are cross-sectional diagrams illustrating a method of manufacturing a semiconductor device according to an exemplary embodiment of the present inventive concept.

Figure 12:
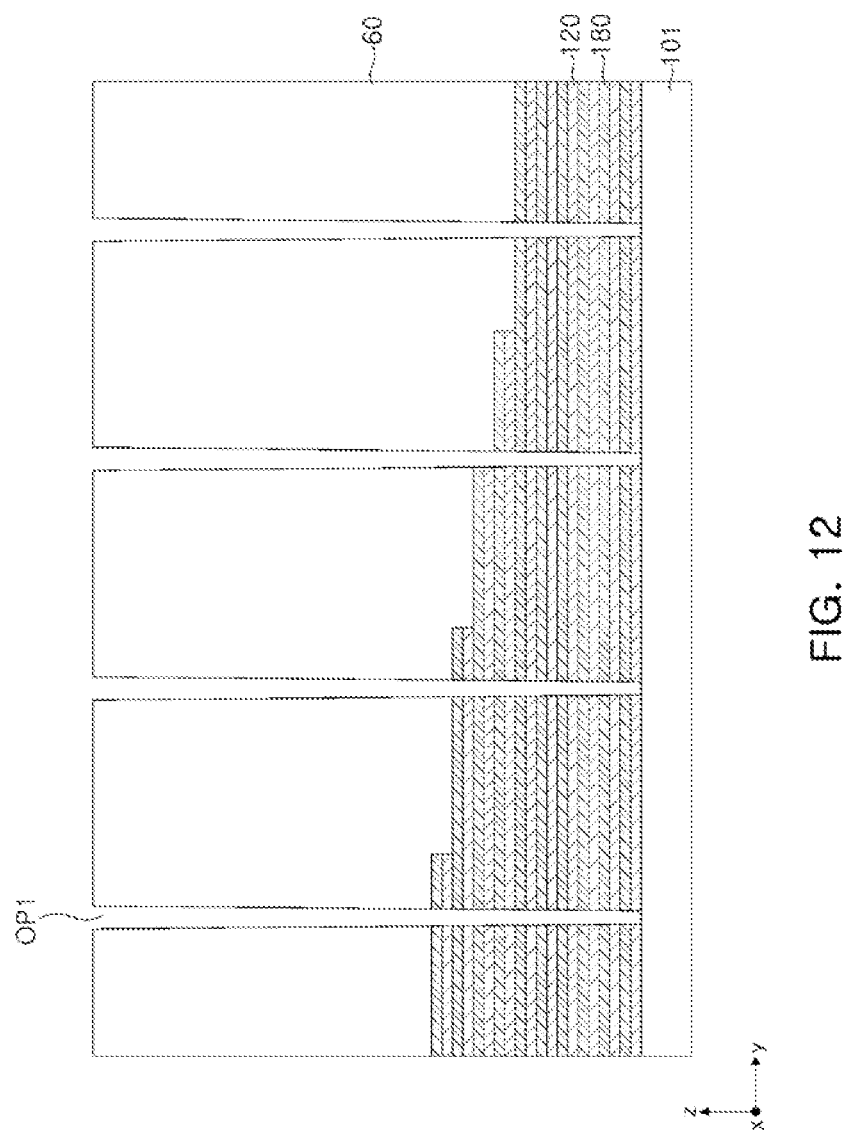
FIGS. 12 to 24 are cross-sectional diagrams illustrating a method of manufacturing a semiconductor device according to an exemplary embodiment of the present inventive concept.

Referring to FIG. 12, the sacrificial layers 180 and the mold insulating layers 120 may be alternately stacked on the substrate 101. A portion of each of the sacrificial layers 180 and the mold insulating layers 120 may be removed to extend the sacrificial layers 180 by different lengths in the second direction in the pad region PAD.

The sacrificial layers 180 may be replaced with gate electrodes 130 through a subsequent process. The sacrificial layers 180 may be formed of a material having an etch selectivity with respect to the mold insulating layers 120 and may be able to be etched. For example, the mold insulating layers 120 may be formed of at least one of silicon oxide and silicon nitride, and the sacrificial layers 180 may be formed of a material selected from among silicon, silicon oxide, silicon carbide, or silicon nitride, different from a material of the mold insulating layers 120.

In exemplary embodiments of the present inventive concept, a thickness of each of the mold insulating layers 120 and a thickness of each of the sacrificial layers 180 may be relatively thin in consideration of a relationship with the other elements. In exemplary embodiments of the present inventive concept, thicknesses of the mold insulating layers 120 may not be the same. For example, each of lowermost mold insulating layers 120 may have a relatively thin thickness, and each of uppermost mold insulating layers 120 may have a relatively great thickness. Thicknesses of the mold insulating layers 120 and the sacrificial layers 180 and the number of included films are not limited to the exemplary embodiment illustrated in the diagram, and may be varied.

A photolithography process and an etching process may be repeatedly performed on the sacrificial layers 180 such that upper sacrificial layers 180 may extend less than lower sacrificial layers 180 in the pad region PAD. Accordingly, the sacrificial layers 180 may form a staircase shape. A material for forming the sacrificial layers 180 may be additionally deposited in regions in which the sacrificial layers 180 extend further than the upper sacrificial layers 180, and each of end portions of the sacrificial layers 180 may have a relatively great thickness. The interlayer insulating layer 60 covering an upper portion of a stack structure of the sacrificial layers 180 and the mold insulating layers 120 may be formed.

A first opening OP1 penetrating the sacrificial layers 180 and the mold insulating layers 120 may be formed.

The first opening OP1 may be formed by forming a mask layer using a photolithography process, and performing a first etching process, e.g., anisotropic etching of the sacrificial layers 180 and the mold insulating layers 120. The first opening OP1 may be formed in a trench form extending in the second direction, and a width of the first opening OP1 taken in the second direction may decrease towards the substrate 101. The first opening OP1 may extend in the first direction. In the first etching process, the substrate 101 may be exposed in a lower portion of the first opening OP1, and side walls of the sacrificial layers 180 and side walls of the mold insulating layers 120 may be exposed on both side walls of the first opening OP1.

Figure 13:
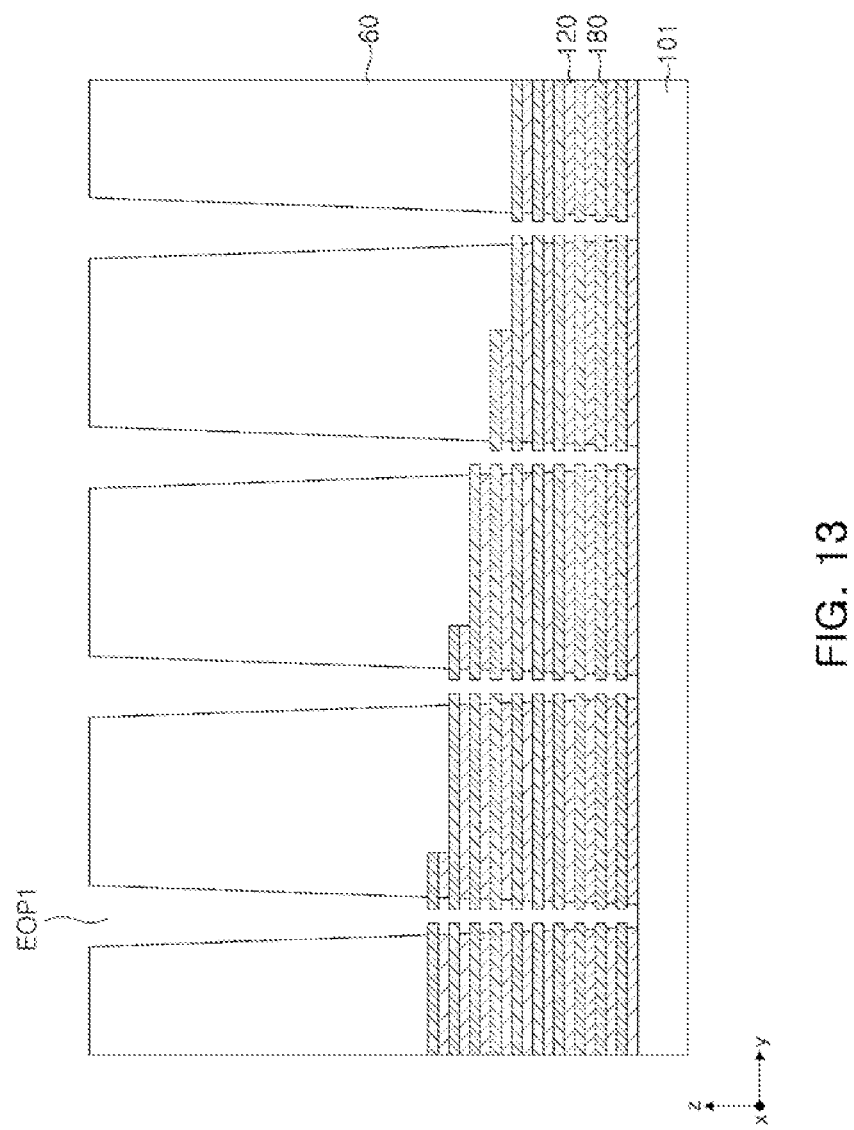

Referring to FIG. 13, an extended first opening EOP1 may be formed by performing a second etching process for selectively etching side walls of the interlayer insulating layer 60, side walls of the exposed sacrificial layers 180, and side walls of the mold insulating layers 120. The extended first opening EOP1 may be formed through the second etching process, additionally etching the first opening OP1 in the first direction. Portions of upper surfaces and lower surfaces of the sacrificial layers 180 may be exposed through the extended first opening EOP1.

Figure 14:
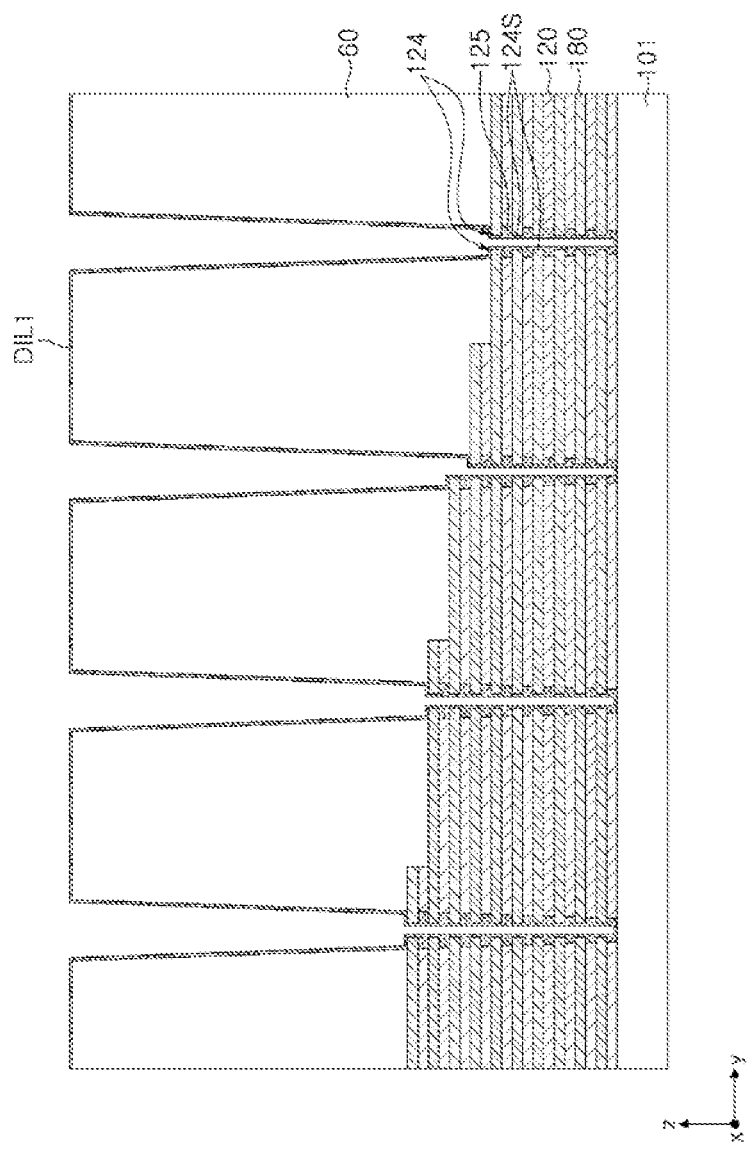

Referring to FIG. 14, the first dummy insulating layers DIL1 and the extending portions 125 may be formed in the extended first opening EOP1. The first dummy insulating layers DIL1 and the extending portions 125 may be formed using an atomic layer deposition (ALD) process or a chemical vapor deposition (CVD) process. The first dummy insulating layers DIL1 and the extending portions 125 may include a material different from a material of the mold insulating layers 120. For example, the first dummy insulating layers DIL1 and the extending portions 125 may include aluminum oxide ($Al_2O_3$), but the inventive concept is not limited thereto.

The extending portions 125 may be formed on portions of upper and lower surfaces of the sacrificial layers 180, exposed through the extended first opening EOP1, and on side walls of the mold insulating layers 120. A thickness of each of the extending portions 125 taken in the third direction may be substantially the same as a thickness of each of the mold insulating layers 120 taken in the third direction.

As the first dummy insulating layers DIL1 are formed in the extended first opening EOP1, the first dummy insulating layers DIL1 may be formed along both side walls of the extended first opening EOP1. The first dummy insulating layers DIL1 may cover a portion of an upper surface of the interlayer insulating layer 60 which is not etched. The horizontal portions 124 disposed substantially in parallel with the substrate 101 may be included in a region in which the first dummy insulating layers DIL1 are in contact with upper gate electrodes 130. The horizontal portions 124 may cover a portion of an upper surface of each of the upper gate electrodes 130.

Figure 15:
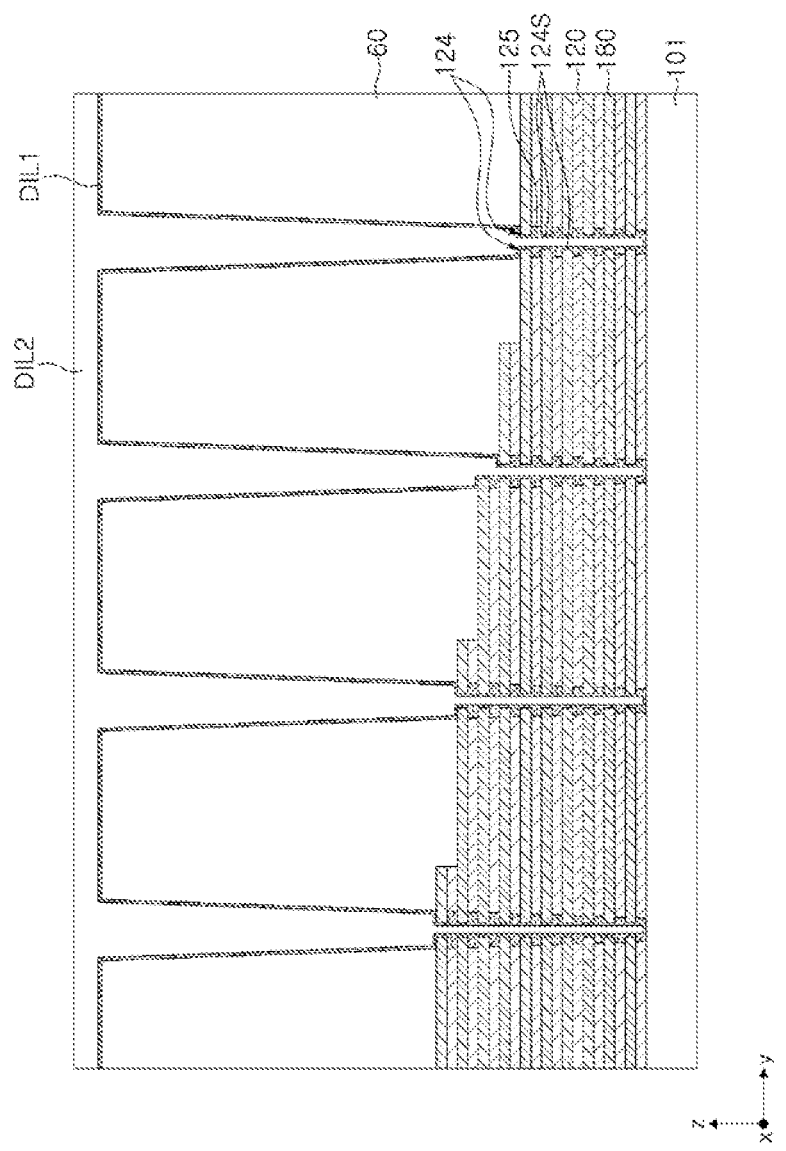

Referring to FIG. 15, a space between the first dummy insulating layers DIL1 may be filled with the second dummy insulating layers DIL2 in the extended first opening EOP1. The second dummy insulating layers DIL2 may cover an upper surface of the interlayer insulating layer 60. The second dummy insulating layers DIL2 may be formed by an atomic layer deposition (ALD) process or a chemical vapor deposition (CVD) process. The second dummy insulating layers DIL2 may include a material different from a material of the first dummy insulating layers DIL1. For example, the second dummy insulating layers DIL2 may include an insulating material such as silicon oxide or silicon nitride.

The first dummy insulating layers DIL1 and the second dummy insulating layers DIL2 may be included in the first separation regions MS1.

Figure 16:
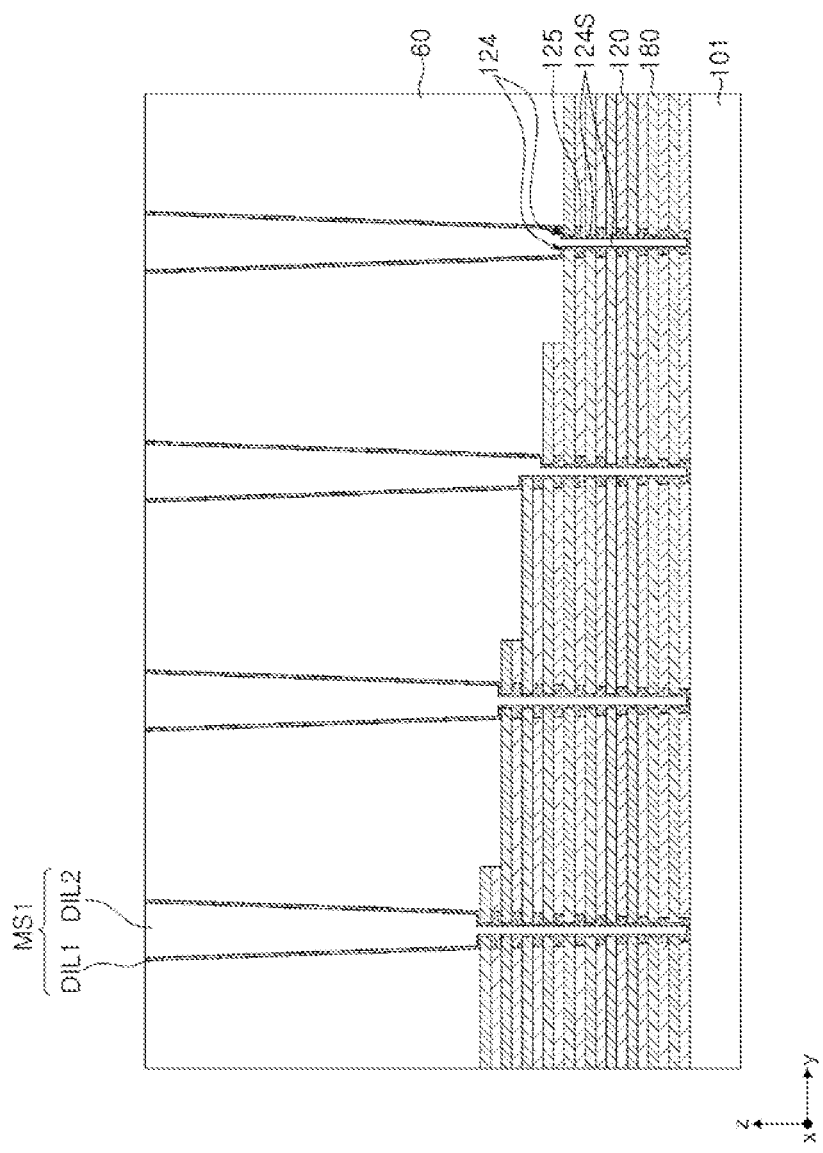

Referring to FIG. 16, a planarization process may be performed on upper portions of the first dummy insulating layers DIL1, the second dummy insulating layers DIL2, and the interlayer insulating layer 60 using a chemical mechanical polishing (CMP) process.

Figure 17:
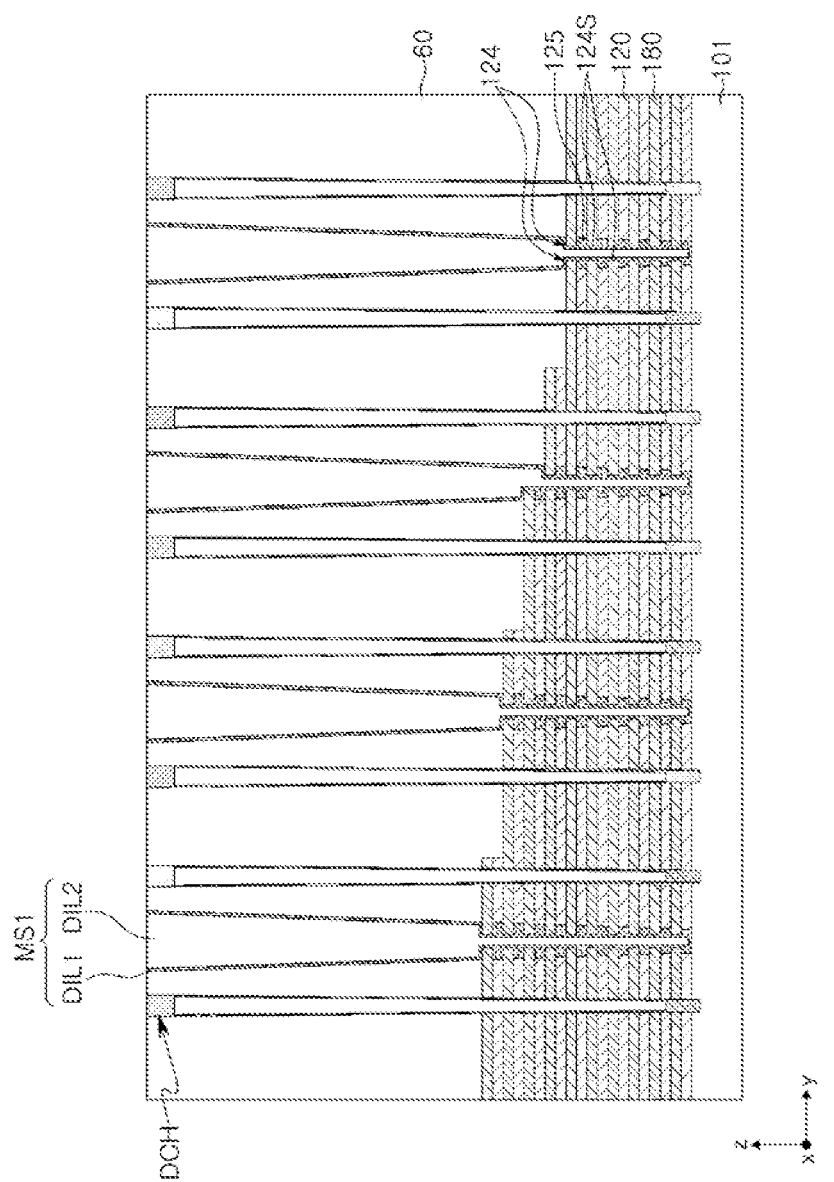

Referring to FIG. 17, the dummy channels DCH penetrating the interlayer insulating layer 60, the sacrificial layers 180, and the mold insulating layers 120 may be formed. The dummy channels DCH may be formed together with the channels CH of the cell array region CAR in the same process, and may have a structure the same as a structure of internal regions of the channels CH.

Figure 18:
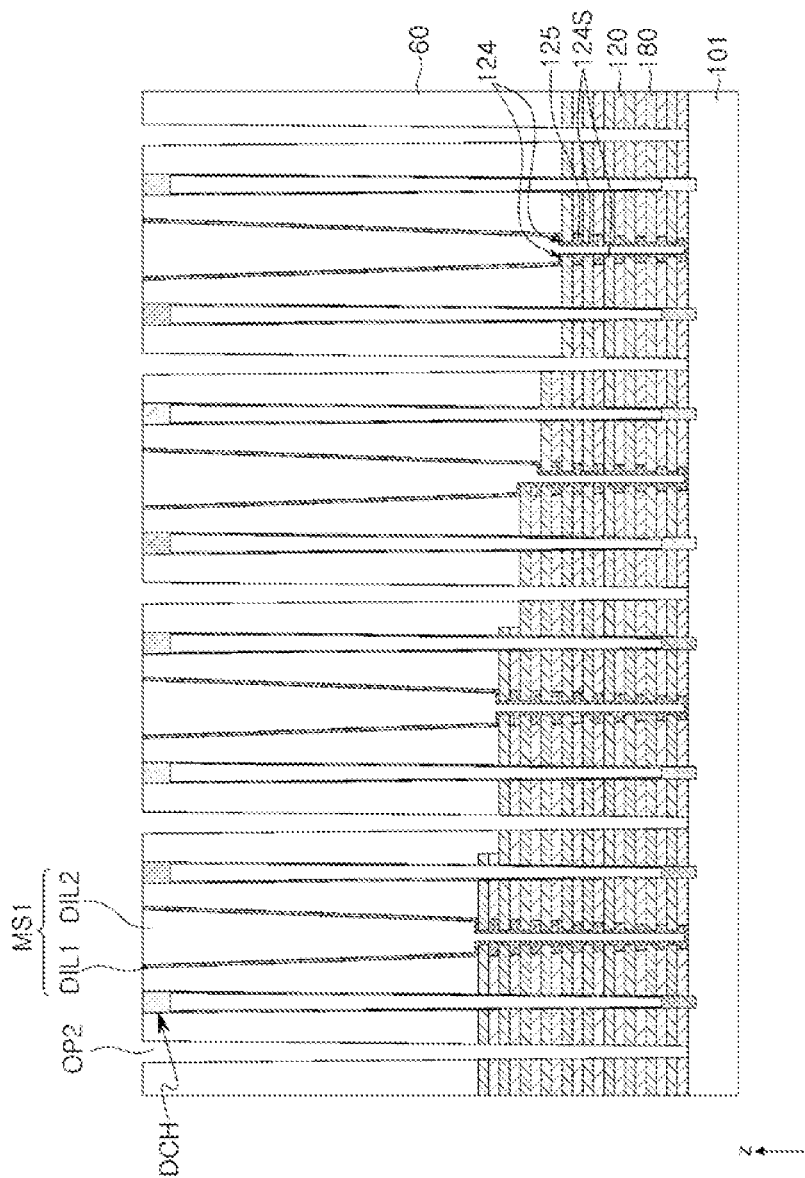

Referring to FIG. 18, a second opening OP2 penetrating the sacrificial layers 180 and the mold insulating layers 120 may be formed.

The second opening OP2 may be formed by forming a mask layer using a photolithography process and performing an anisotropic etching process on the sacrificial layers 180 and the mold insulating layers 120. The second opening OP2 may have a trench form extending in the second direction, and a width of the second opening OP2 may decrease towards the substrate 101. The second opening OP2 may extend in the first direction. In this process, the substrate 101 may be exposed in a lower portion of the second opening OP2, and side walls of the sacrificial layers 180 and side walls of the mold insulating layers 120 may be exposed on both side walls of the second opening OP2.

Figure 19:
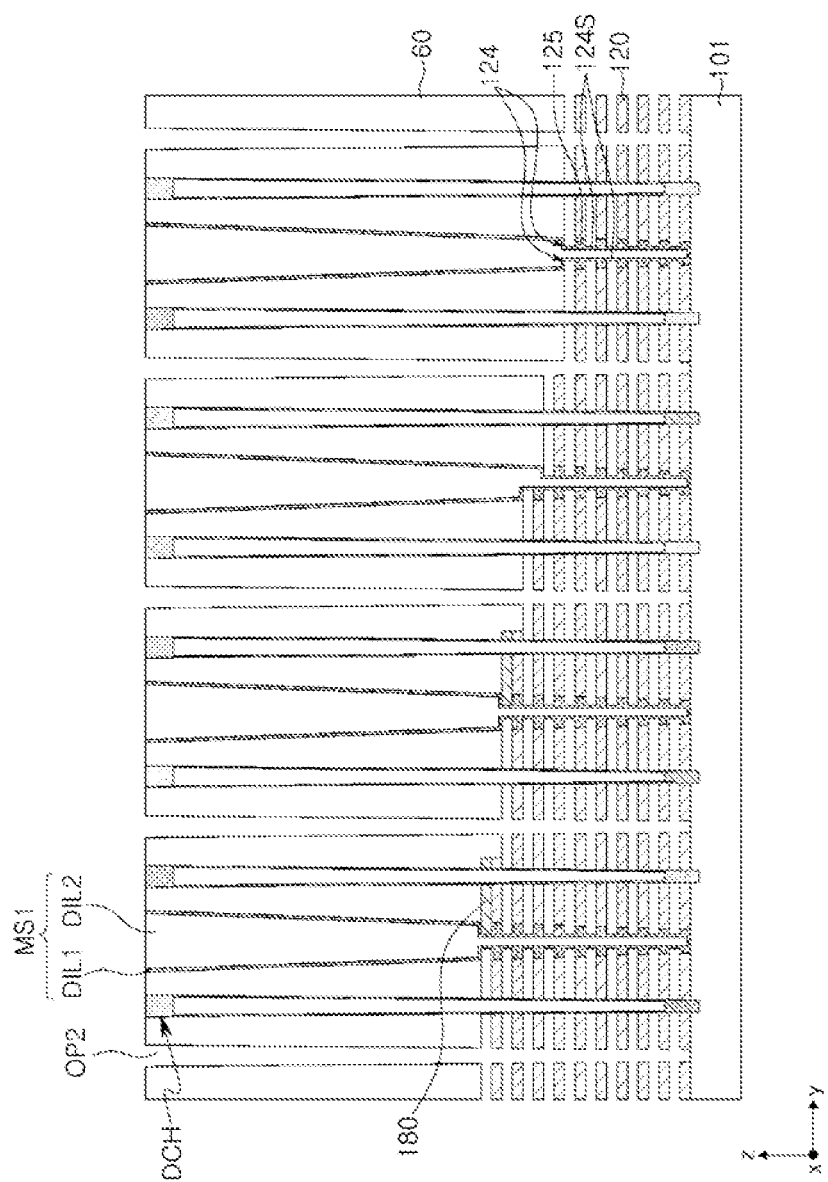

Referring to FIG. 19, the sacrificial layers 180 may be removed through the second opening OP2.

The sacrificial layers 180 may be selectively removed with respect to the mold insulating layers 120 using a wet etching process. Accordingly, a plurality of side surface openings may be formed between the mold insulating layers 120, and portions of side walls of the dummy channels DCH may be exposed through the side surface openings. In this process, structural stability of the mold insulating layers 120 may degrade after the sacrificial layers 180 are removed, but the mold insulating layers 120 may be stably supported by the extending portions 125 each having a fishbone shape and adjacent to the mold insulating layers 120, the first dummy insulating layers DILL and the dummy channels DCH. As the extending portions 125, the first dummy insulating layers DILL and the dummy channels DCH may work as support stands, collapse of the mold insulating layers 120 may be prevented. Accordingly, a bridge defect caused by a decrease of widths of the mold insulating layers 120 and the gate electrodes 130 in the third direction may be prevented. That is because a length of each of the mold insulating layers 120 supported by a single dummy channel DCH, taken in the second direction, may decrease by the formation of the extending portions 125.

In this process, portions of the sacrificial layers 180 may not be selectively removed with respect to the mold insulating layers 120 and may remain. For example, uppermost sacrificial layers of the sacrificial layers 180, which are disposed between the second opening OP2 and the first separation regions MS1 and are not penetrated by the second opening OP2, may remain.

Figure 20:
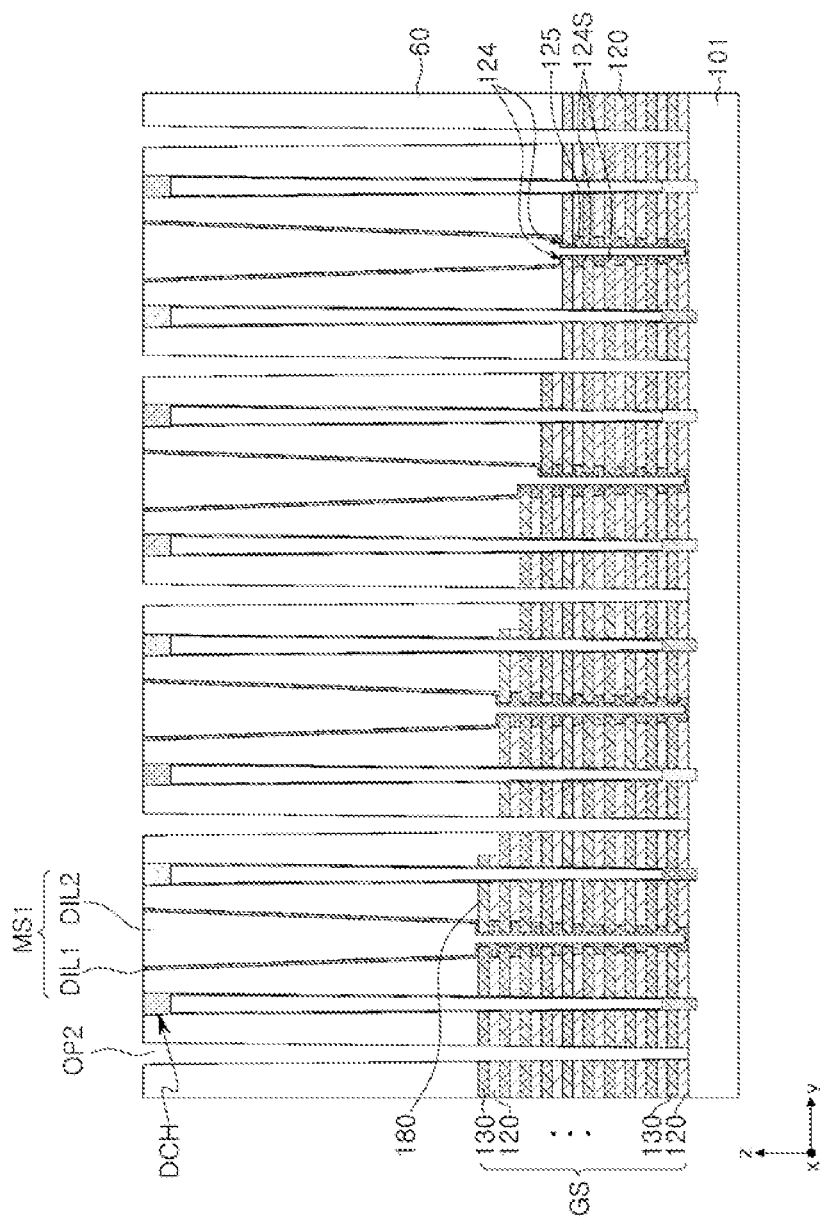

Referring to FIG. 20, a region from which the sacrificial layers 180 are removed may be filled with a conductive material, thus forming the gate electrodes 130.

The gate electrodes 130 may include a metal, polycrystalline silicon, or a metal silicide material. The second opening OP2 may provide a transfer path for a material for forming the gate electrodes 130.

In exemplary embodiments of the present inventive concept, a thickness of each of the mold insulating layers 120 and a thickness of each of the gate electrodes 130 may be relatively thin in consideration of a relationship with the other elements. In exemplary embodiments of the present inventive concept, thicknesses of the gate electrodes 130 may not be the same. For example, the gate electrode 130 in a lowermost portion may have a relatively thin thickness, and the gate electrode 130 in an uppermost portion may have a relatively great thickness. Thicknesses of the gate electrodes 130 may be relatively thin in consideration of a relationship with the other elements.

Figure 21:
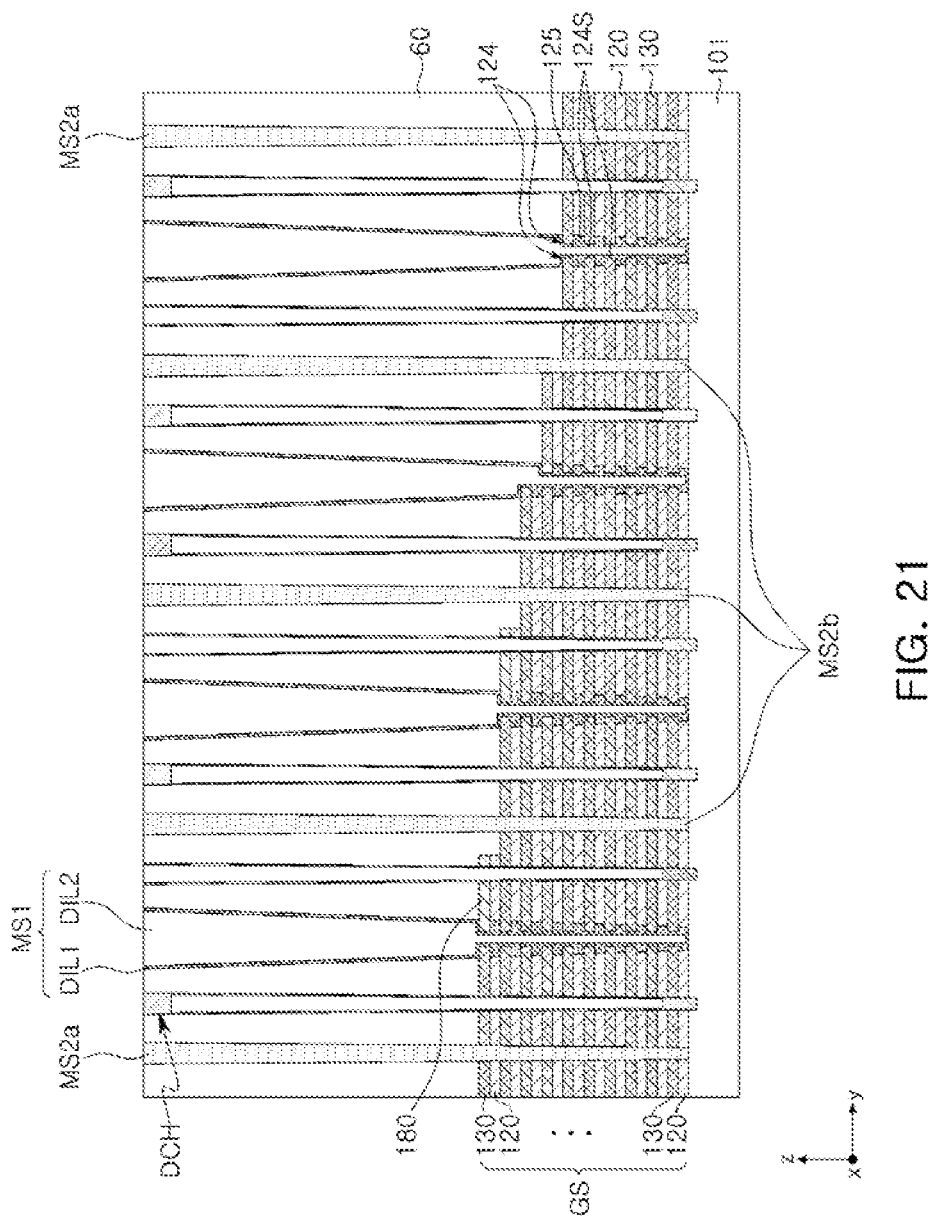

Referring to FIG. 21, the second opening OP2 may be filled with an insulating material such as silicon oxide or silicon nitride, and may be included in the second separation regions MS2 of the semiconductor device 100. Upper surfaces of the second separation regions MS2 may be disposed on a level higher than upper surfaces of the first separation regions MS1, and may be disposed on a level higher than upper surfaces of the dummy channels DCH.

Figure 22:
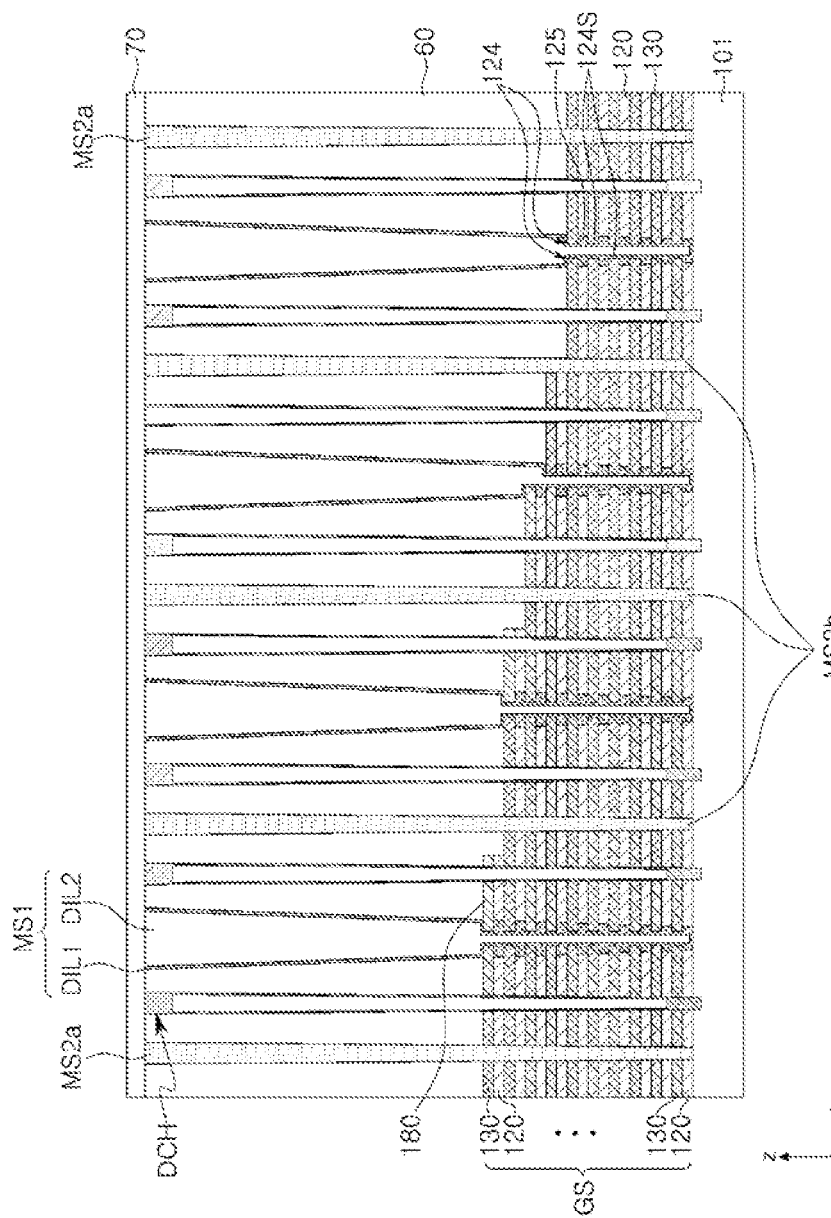
Figure 23:
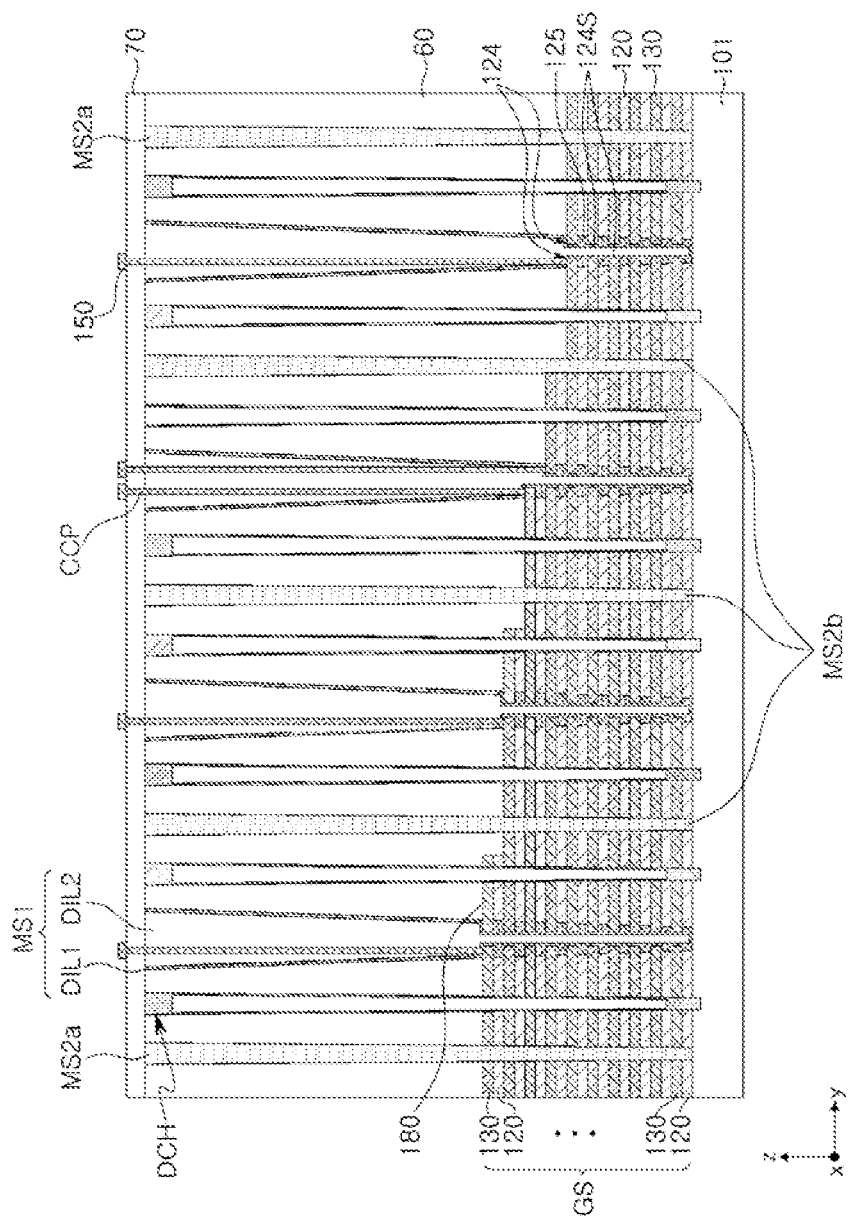

Referring to FIGS. 22 and 23, the first capping insulating layer 70 covering an upper surface of the interlayer insulating layer 60 may be formed. The cell contact plugs CCP penetrating the second dummy insulating layers DIL2, penetrating the horizontal portions 124 of the first dummy insulating layers DIL1 and in contact with the gate electrodes 130 may be formed. The lower wiring layer 150 in contact with the cell contact plugs CCP and disposed on an upper surface of the first capping insulating layer 70 may be formed.

Figure 24:
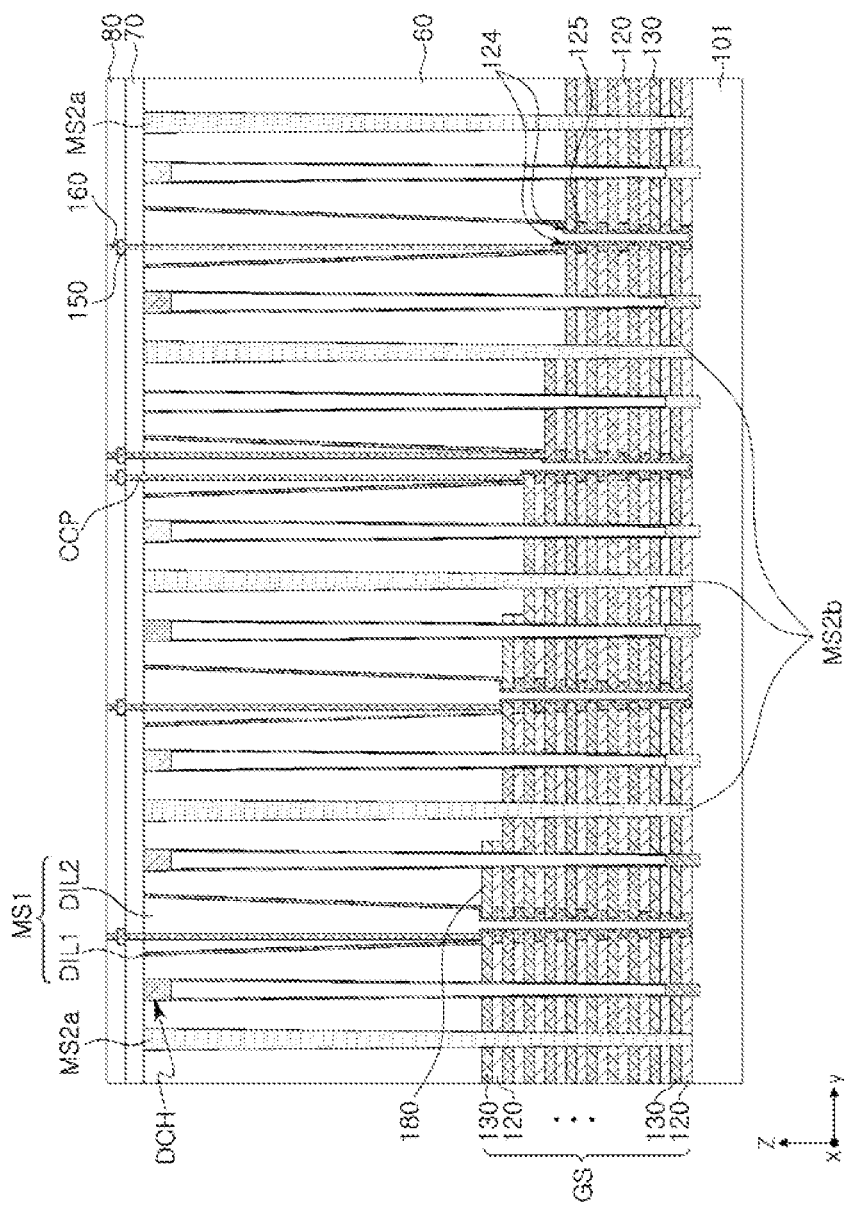

Referring to FIG. 24, the second capping insulating layer 80 covering an upper surface of the first capping insulating layer 70 and an upper surface of the lower wiring layer 150 may be formed. The intermediate wiring layer 160 penetrating the second capping insulating layer 80 and in contact with the lower wiring layer 150 may be formed. The upper wiring layer 170 (as shown in FIG. 5B) in contact with the intermediate wiring layer 160 and disposed on an upper surface of the second capping insulating layer 80 may be formed.

The lower wiring layer 150, the intermediate wiring layer 160, and the upper wiring layer 170 may be included in and referred to as the wiring layer 190, and may be electrically connected to the cell contact plugs CCP.

According to the aforementioned exemplary embodiments of the present inventive concept, by controlling a structure of a region in which the cell contact plugs are in contact with the gate electrodes and a region in which the dummy separation regions are in contact with the mold insulating layers, a semiconductor device having improved electrical properties may be provided.

While the present inventive concept has been shown and described above with reference to exemplary embodiments thereof, it will be apparent to those of ordinary skill in the art that modifications and variations in form and details could be made thereto without departing from the spirit and scope of the present inventive concept as set forth by the appended claims.

What is claimed is:

1. A semiconductor device, comprising:
   a substrate having a cell array region and a pad region;
   a stack structure including gate electrodes and mold insulating layers alternately stacked on the substrate in a vertical direction perpendicular to an upper surface of the substrate and having a staircase shape on the pad region of the substrate;
   a plurality of first separation regions penetrating the stack structure vertically on the pad region of the substrate, having a line type shape extending in a first direction perpendicular to the vertical direction in a plan view, each of the plurality of first separation regions including a first insulating layer and a second insulating layer;
   wherein the first insulating layer covers internal side walls of each of the plurality of first separation regions,
   wherein the first insulating layer includes horizontal portions covering a portion of an upper surface of an upper gate electrode of the gate electrodes, a side portion extending from the horizontal portions towards the upper surface of the substrate, and extending portions extending from the side portion towards the mold insulating layers in a second direction perpendicular to the first direction, and
   wherein the second insulating layer is disposed on an inner side surface of the first insulating layer;
   a plurality of second separation regions dividing the stack structure into a plurality of regions and extending in the first direction; and
   cell contact plugs penetrating the horizontal portions of the first insulating layer and connected to the gate electrodes.

2. The semiconductor device of claim 1, wherein the extending portions include a first extending portion and a second extending portion disposed on different levels in the vertical direction, and one end of the first extending portion and one end of the second extending portion are disposed in different positions in the second direction.

3. The semiconductor device of claim 1, wherein the second insulating layer has side surfaces facing side surfaces of the gate electrodes in contact with the portion and extends on the horizontal portions.

4. The semiconductor device of claim 1, wherein each of the extending portions has a recess portion having a concave shape in the second direction.

5. The semiconductor device of claim 1, further comprising:
   an interlayer insulating layer covering the stack structure on the pad region of the substrate,
   wherein each of the plurality of first separation regions includes a first upper separation region in contact with the interlayer insulating layer and a first lower separation region in contact with the stack structure, and
   wherein a first width of the first upper separation region taken in the second direction is greater than a second width of the first lower separation region taken in the second direction.

6. The semiconductor device of claim 1, wherein the plurality of second separation regions extend further than the plurality of first separation regions in the first direction on the substrate.

7. The semiconductor device of claim 6, wherein the plurality of second separation regions are disposed on the cell array region and on the pad region, and the plurality of first separation regions are disposed on the pad region.

8. The semiconductor device of claim 1, wherein the extending portions are disposed below the cell contact plugs.

9. The semiconductor device of claim 1, wherein the cell contact plugs include first and second cell contact plugs penetrating the second insulating layer and having heights different from each other in the vertical direction.

10. The semiconductor device of claim 9, wherein a difference in heights between the first and second cell contact plugs is substantially the same as a sum of a thickness of one of the gate electrodes and a thickness of one of the mold insulating layers.

11. The semiconductor device of claim 1, wherein in one of the plurality of first separation regions, a distance between inner side surfaces of the Fat insulating layer facing each other decreases towards a lower end of the one of the plurality of first separation regions.

12. The semiconductor device of claim 1, further comprising:
   at least one sacrificial layer disposed between a given one of the horizontal portions and a given one of the extending portions and including a material different from a material of the gate electrodes.

13. The semiconductor device of claim 1, further comprising:
   a peripheral circuit region provided below the substrate, and including circuit elements electrically connected to the gate electrodes.

14. The semiconductor device of claim 13, further comprising:
a through contact plug electrically connecting the cell array region to the peripheral circuit region in the pad region,
wherein the through contact plug is electrically connected to the cell contact plugs.

15. A semiconductor device, comprising:
a substrate having a cell array region and a pad region;
a stack structure including gate electrodes and mold insulating layers having a staircase shape on the pad region of the substrate;
an interlayer insulating layer covering the stack structure on the pad region of the substrate;
a plurality of first separation regions penetrating the stack structure and the interlayer insulating layer on the pad region of the substrate, wherein each of the plurality of first separation regions has a line type shape in a plan view, and each of the plurality of first separation regions includes a first insulating layer and a second insulating layer;
a plurality of second separation regions dividing the stack structure into a plurality of regions on the substrate and extending in a first direction;
at least one dummy channel disposed between the plurality of first separation regions and the plurality of second separation regions; and
cell contact plugs disposed in the plurality of first separation regions and connected to the gate electrodes,
wherein the first insulating layer includes horizontal portions covering a portion of an upper surface of an upper gate electrode of the gate electrodes, a side portion covering at least one end of the gate electrodes and extending towards an upper surface of the substrate, and extending portions between the gate electrodes and in contact with side surfaces of the mold insulting layer,
wherein the second insulating layer has side surfaces facing side surfaces of the gate electrodes in contact with the side portion and extends on the horizontal portions, and
wherein the cell contact plugs penetrate the horizontal portions of the first insulating layer.

16. The semiconductor device of claim 15, wherein in one of the plurality of first separation regions, the second insulating layer extends to a level lower than a bottom of the horizontal portions.

17. The semiconductor device of claim 15, wherein the first insulating layer includes a material different from a material of the mold insulating layers.

18. The semiconductor device of claim 15, wherein one or more of the plurality of first separation regions are disposed between the plurality of second separation regions.

19. A semiconductor device, comprising:
a substrate having a cell array region and a pad region;
a stack structure including gate electrodes and mold insulating layers alternately stacked on the substrate in a vertical directions perpendicular to an upper surface of the substrate and having a staircase shape on the pad region of the substrate;
an interlayer insulating layer covering the stack structure on the pad region of the substrate;
separation insulating layers extending in a first direction perpendicular to the vertical direction and dividing the stack structure into a plurality of regions in a second direction perpendicular to the first direction and including a lower structure in contact with the stack structure and an upper structure in contact with the interlayer insulating layer;
cell contact plugs disposed in the separation insulating layers and connected to the gate electrodes,
wherein the separation insulating layers include a core insulating layer and a supporting insulating layer disposed on both sides of the core insulating layer,
wherein the core insulating layer extends from the lower structure to the upper structure,
wherein the supporting insulating layer includes a side portion in contact with the core insulating layer in the lower structure and extending portions extending from the side portion towards the mold insulating layers in the lower structure, and
wherein the extending portions are spaced apart from each other in the vertical direction.

20. The semiconductor device of claim 19, wherein each of the extending portions has a recess portion having a concave shape.

* * * * *